(12) United States Patent
Wells et al.

(10) Patent No.: US 11,563,024 B2
(45) Date of Patent: Jan. 24, 2023

(54) INTEGRATED ASSEMBLIES AND METHODS OF FORMING INTEGRATED ASSEMBLIES

(71) Applicant: Micron Technology, Inc., Boise, ID (US)

(72) Inventors: David H. Wells, Boise, ID (US); Aaron R. Wilson, Boise, ID (US); Paolo Tessariol, Arcore (IT)

(73) Assignee: Micron Technology, Inc., Boise, ID (US)

( * ) Notice: Subject to any disclaimer, the term of this patent is extended or adjusted under 35 U.S.C. 154(b) by 156 days.

(21) Appl. No.: 17/002,339

(22) Filed: Aug. 25, 2020

(65) Prior Publication Data

US 2022/0068952 A1 Mar. 3, 2022

(51) Int. Cl.
| | |
|---|---|
| *H01L 27/11582* | (2017.01) |
| *H01L 27/11519* | (2017.01) |
| *H01L 27/1157* | (2017.01) |
| *H01L 27/11556* | (2017.01) |
| *H01L 27/11565* | (2017.01) |
| *H01L 27/11524* | (2017.01) |

(52) U.S. Cl.
CPC .... *H01L 27/11582* (2013.01); *H01L 27/1157* (2013.01); *H01L 27/11519* (2013.01); *H01L 27/11524* (2013.01); *H01L 27/11556* (2013.01); *H01L 27/11565* (2013.01)

(58) Field of Classification Search
CPC ................................................. H01L 27/11582
See application file for complete search history.

(56) References Cited

U.S. PATENT DOCUMENTS

| | | | |
|---|---|---|---|
| 2014/0217488 A1* | 8/2014 | Thimmegowda | ............................ H01L 27/11556 257/314 |
| 2016/0079263 A1 | 3/2016 | Yasuda | |
| 2017/0148852 A1 | 5/2017 | Boniaridi et al. | |
| 2017/0194348 A1 | 7/2017 | Hopkins | |
| 2019/0288000 A1 | 9/2019 | Choi | |
| 2021/0143176 A1* | 5/2021 | Yun | ................... H01L 27/11524 |

FOREIGN PATENT DOCUMENTS

WO WO 11/2021
PCT/US2021/044272

* cited by examiner

*Primary Examiner* — Christopher A Johnson
(74) *Attorney, Agent, or Firm* — Wells St. John P.S.

(57) ABSTRACT

Some embodiments include an integrated assembly having a first deck with first memory cells arranged in first tiers disposed one atop another, and having a second deck over the first deck and with second memory cells arranged in second tiers disposed one atop another. Cell-material-pillars pass through the first and second decks. The cell-material-pillars have first inter-deck inflections associated with a boundary between the first and second decks. The cell-material-pillars are arranged within a configuration which includes a first memory-block-region and a second memory-block-region. A panel is between the first and second memory-block-regions. The panel has a second inter-deck inflection associated with the boundary between the first and second decks. Some embodiments include methods of forming integrated assemblies.

16 Claims, 31 Drawing Sheets

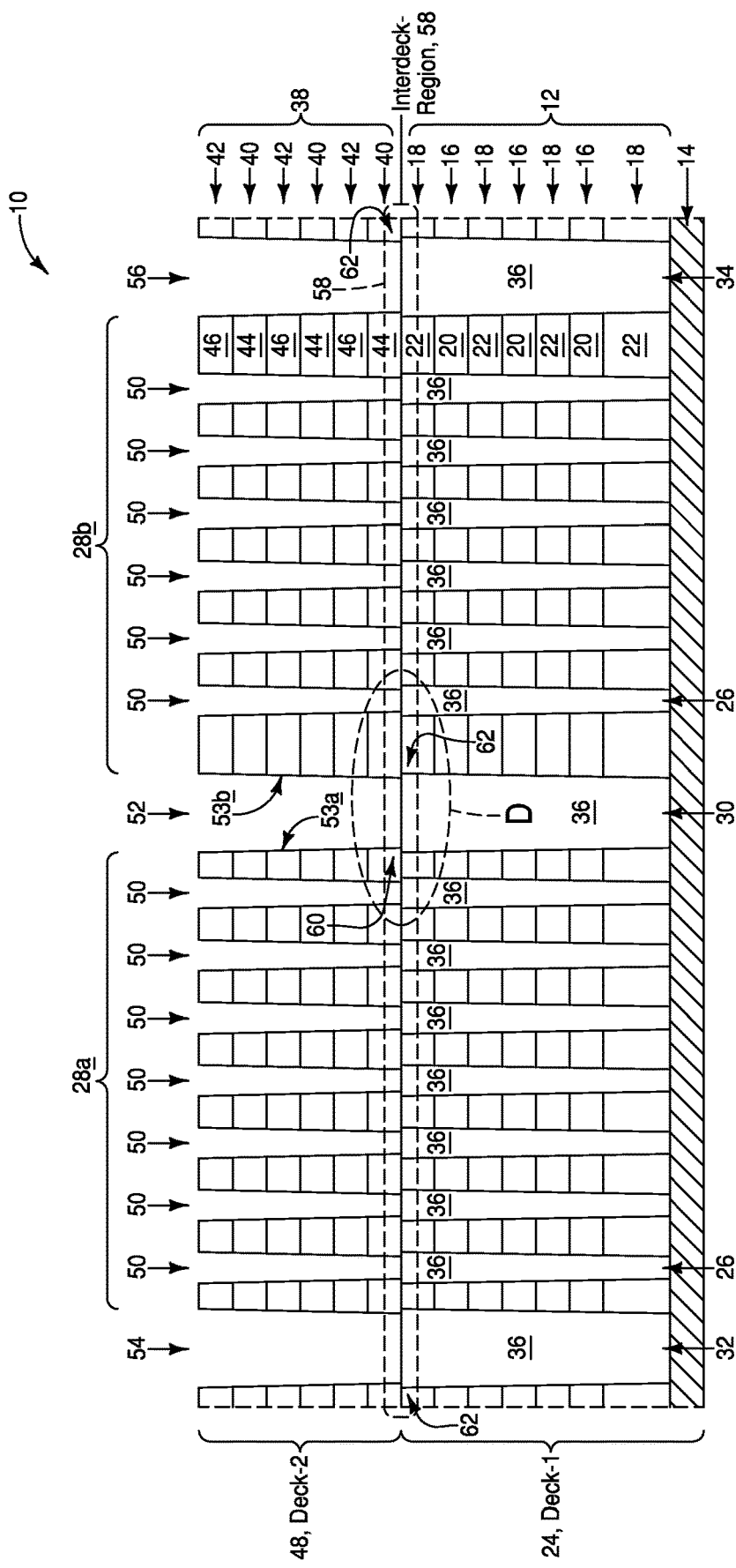

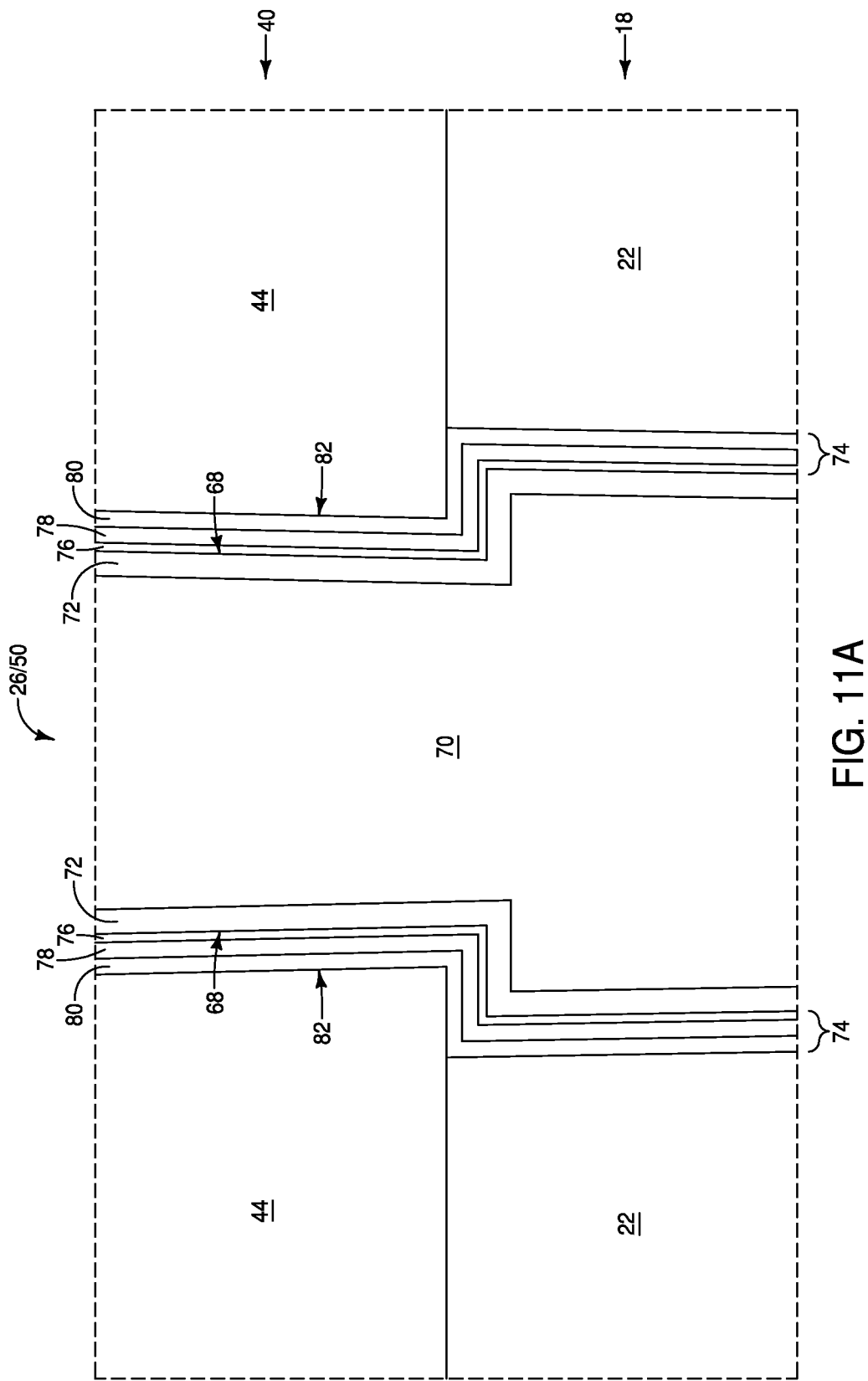

INTEGRATED ASSEMBLIES AND METHODS OF FORMING INTEGRATED ASSEMBLIES

TECHNICAL FIELD

Integrated assemblies (e.g., NAND assemblies) and methods of forming integrated assemblies.

BACKGROUND

Memory provides data storage for electronic systems. Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a block diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_J$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture and improved methods for fabricating NAND architecture.

BRIEF DESCRIPTION OF THE DRAWINGS

FIGS. 5-14 are diagrammatic cross-sectional side views of a region of an integrated assembly at example sequential process stages of an example method for forming an example memory array. FIG. 11A is an enlarged diagrammatic cross-sectional side view of a region "A" of FIG. 11.

DETAILED DESCRIPTION OF THE ILLUSTRATED EMBODIMENTS

Some embodiments include methods of forming memory with two or more decks stacked one atop another, and some embodiments include configurations having two or more decks stacked one atop another. Example embodiments are described with reference to FIGS. 5-18.

Figure 1:
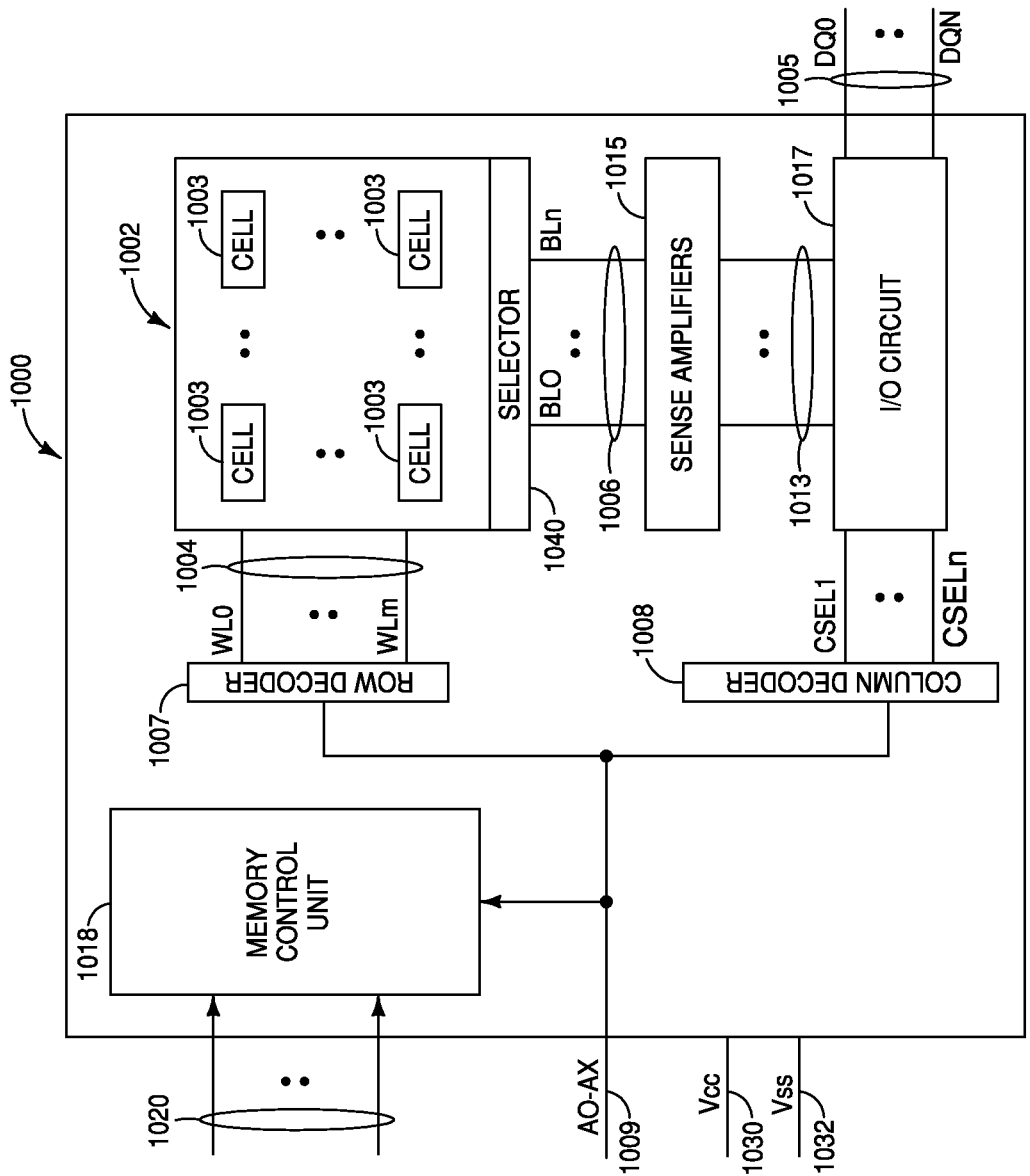
FIG. 1 shows a block diagram of a prior art memory device having a memory array with memory cells.
Figure 2:
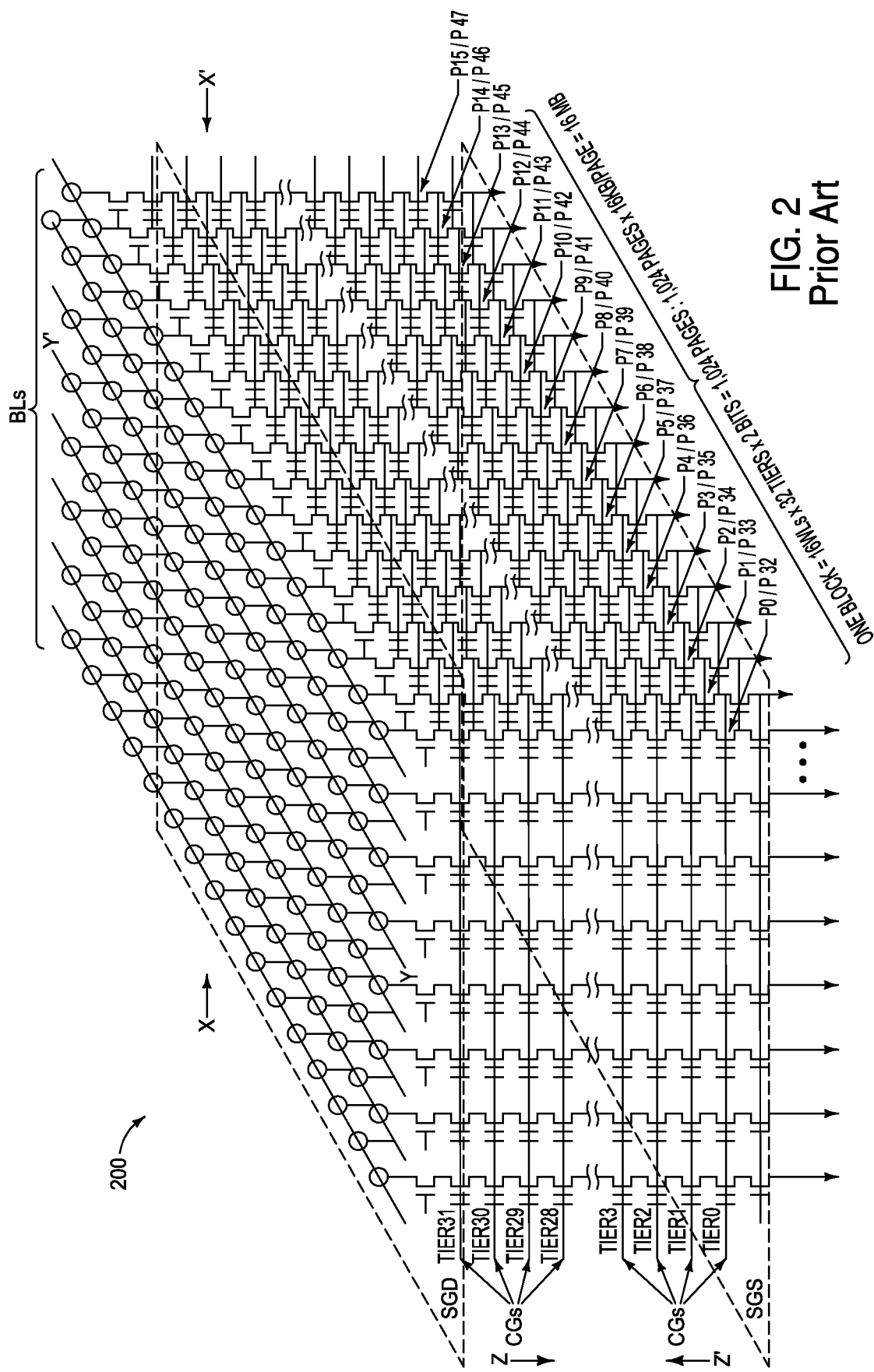
FIG. 2 shows a schematic diagram of the prior art memory array of FIG. 1 in the form of a 3D NAND memory device.
Figure 3:
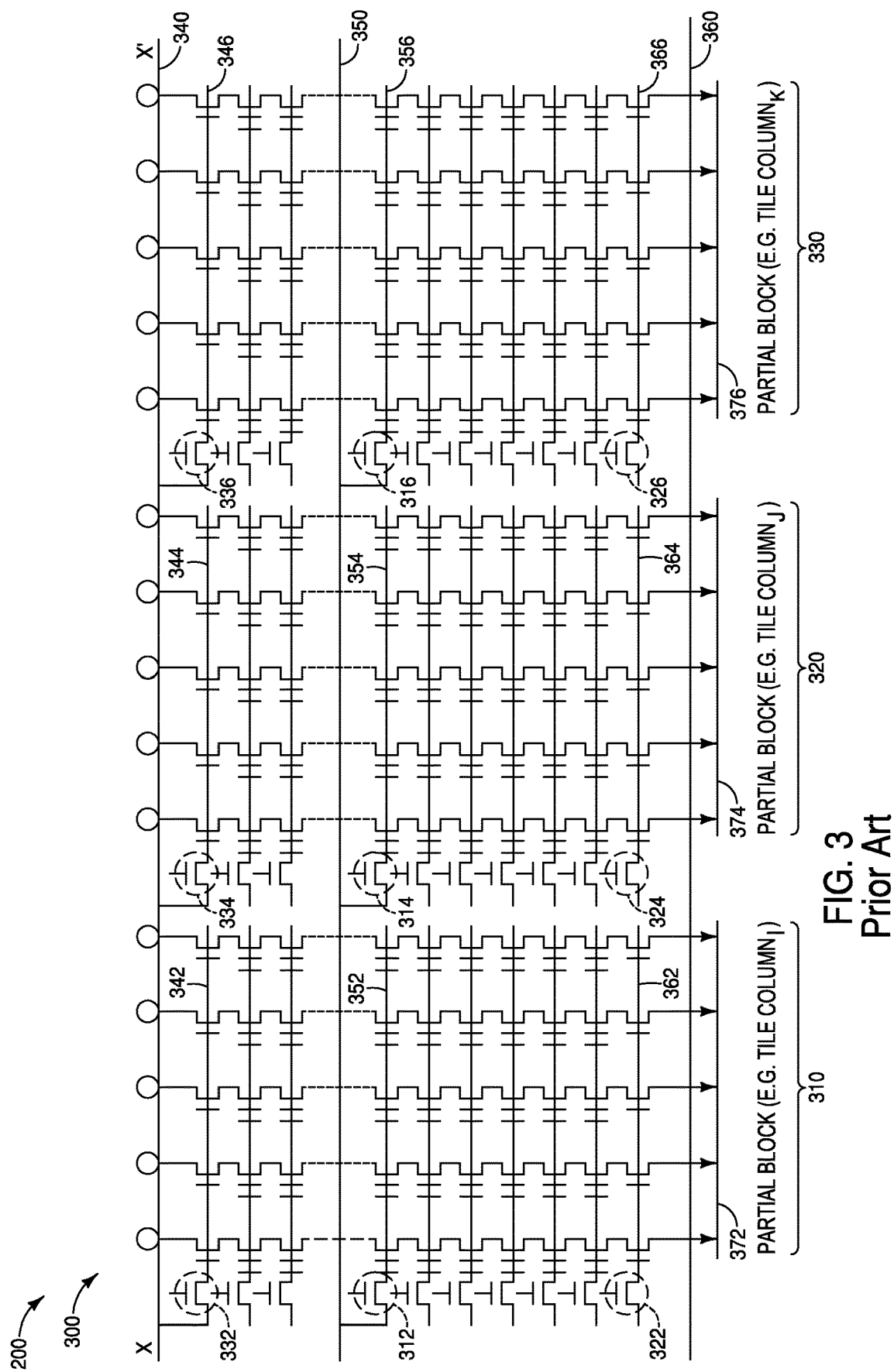
FIG. 3 shows a cross-sectional view of the prior art 3D NAND memory device of FIG. 2 in an X-X' direction.
Figure 4:
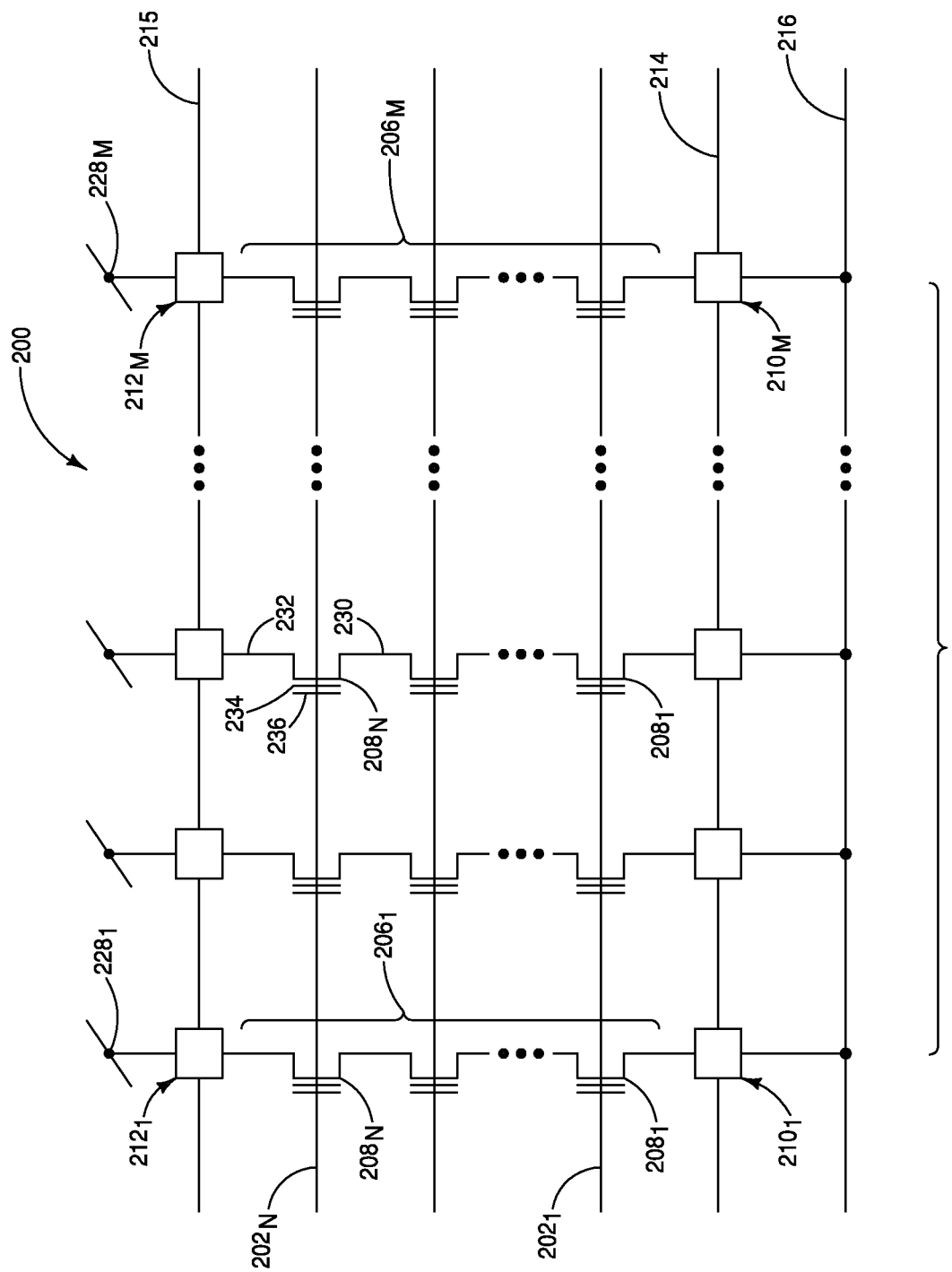
FIG. 4 is a schematic diagram of a prior art NAND memory array.
Figure 5:
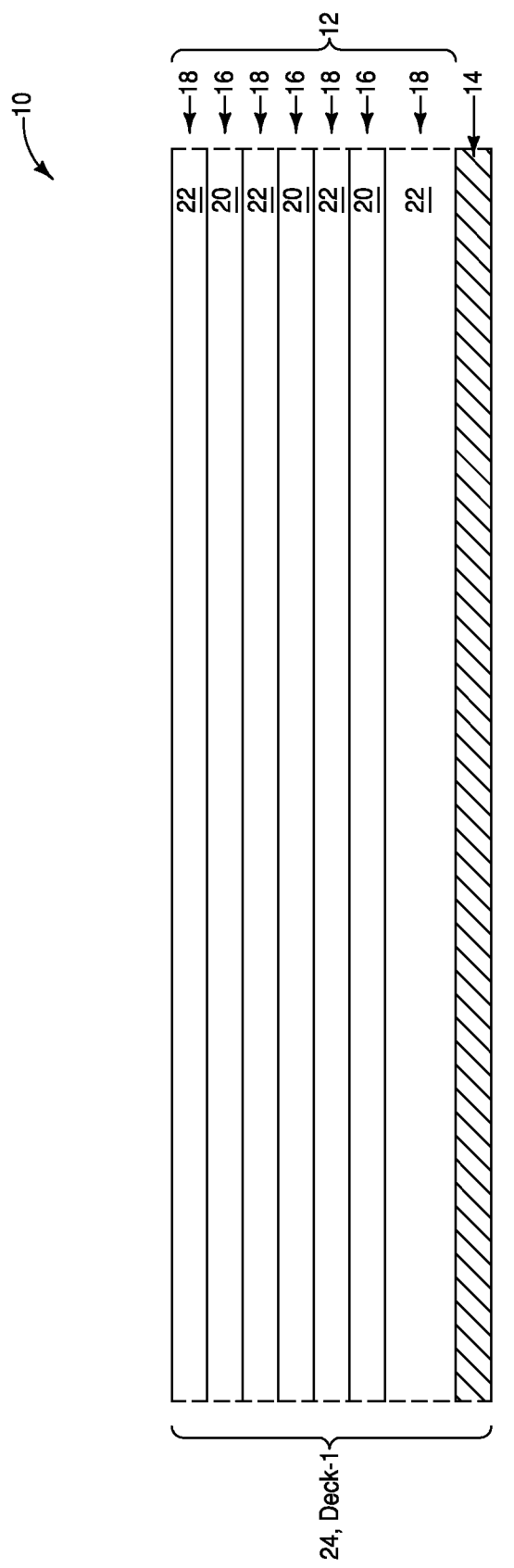

Referring to FIG. 5, an assembly 10 includes a conductive structure 14. The conductive structure 14 may be a source structure analogous to the source structures 216 and 360 described above in the Background section. The conductive structure 14 may comprise any suitable electrically conductive composition(s), and in some embodiments may comprise conductively-doped semiconductor material. The conductively-doped semiconductor material may be conductively-doped silicon (e.g., n-type silicon). The conductively-doped semiconductor material of the source structure 14 may be over one or more additional conductive materials of the source structure 14 (e.g., one or more metal-containing materials, such as, for example, one or both of tungsten and tungsten silicide).

The conductive structure 14 may be supported by a semiconductor base (not shown). The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The base may support CMOS, and the structure 14 may be electrically coupled with the CMOS.

A stack 12 of alternating first and second tiers (levels, layers) 16 and 18 is formed over the conductive structure 14. The stack 12 may comprise any suitable number of alternating tiers 16 and 18. The tiers 16 ultimately become conductive levels of a memory arrangement. There may be any suitable number of tiers 16 to form the desired number of conductive levels. In some embodiments, the number of tiers 16 may be 8, 16, 32, 64, etc.

The first tiers 16 comprise a first material 20. Such first material may comprise any suitable composition(s), and in some embodiments may comprise, consist essentially of, or consist of silicon nitride.

The second tiers 18 comprise a second material 22. Such material may be an insulative material and may comprise any suitable composition(s). In some embodiments, the material 22 may comprise, consist essentially of, or consist of silicon dioxide.

In some embodiments, the materials 20 and 22 may be referred to as a first material and an insulative second material, respectively.

The tiers 16 and 18 may be of any suitable thicknesses; and may be the same thickness as one another, or may be different thicknesses relative to one another. In some embodiments, the tiers 16 and 18 may have vertical thicknesses within a range of from about 10 nanometers (nm) to about 400 nm. In the illustrated embodiment, the bottommost tier 18 is thicker than the other tiers 18. In other embodiments, the bottommost tier 18 may have a thickness which is about the same as the thickness of the other tiers 18, or may be less thick than the other tiers 18.

In some embodiments, the stack 12 may be referred to as a first stack to distinguish it from additional stacks formed at later process stages. The first stack 12 may be considered to be comprised by a first deck 24 (Deck-1). The first deck 24 may also comprise the source structure 14, as shown.

Figure 6:
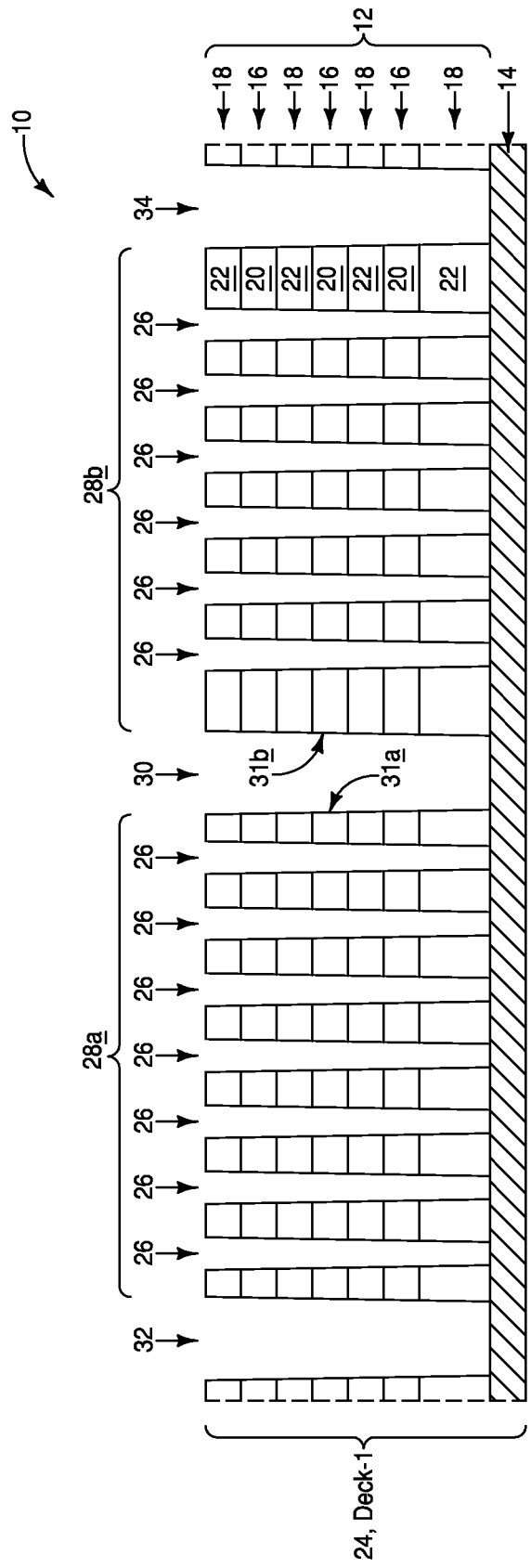
Figure 6A:
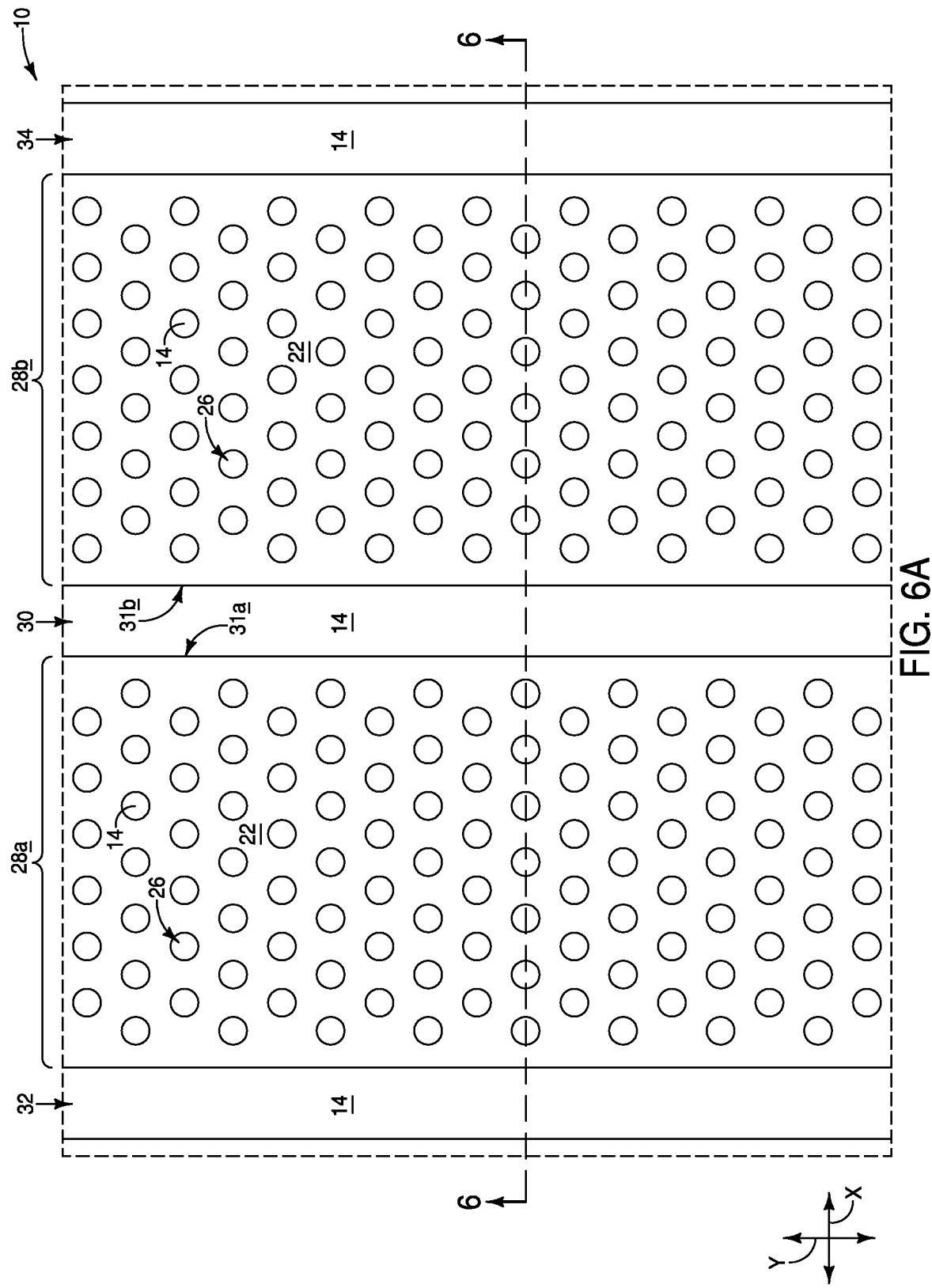
FIGS. 6A, 9A and 14A are diagrammatic top-down views of regions of the integrated assemblies of FIGS. 6, 9 and 14, respectively; with the cross-section of FIG. 6 being along the line 6-6 of FIG. 6A, the cross-section of FIG. 9 being along the line 9-9 of FIG. 9A, and the cross-section of FIG. 14 being along the line 14-14 of FIG. 14A.

Referring to FIGS. 6 and 6A, pillar openings 26 are formed to extend through the stack 12. In the shown embodiment, the pillar openings 26 extend downwardly to an upper surface of the source structure 14.

The pillar openings 26 are arranged within a configuration which includes adjacent memory-block-regions 28a and 28b. The memory-block-regions 28a and 28b may be referred to as first and second memory-block-regions, respectively. The first and second memory-block-regions 28a and 28b may be analogous to the memory blocks (or portions thereof) described above in the Background section.

Slit openings 30, 32 and 34 are also formed to extend through the stack 12. In some embodiments, the slit opening 30 may be referred to as a first slit opening, with such first slit opening being between the first and second memory-block-regions 28a and 28b.

FIG. 6A shows the pillar openings 26 to be circular-shaped in top-down view. In other embodiments, the pillar openings 26 may have other shapes (e.g., elliptical, polygonal, etc.).

FIG. 6A also shows the slit openings 30, 32 and 34 formed to extend along a horizontal y-axis direction. Each of the slit openings has a pair of opposing sidewalls, with the sidewalls of the slit opening 30 being labeled 31a and 31b. The sidewalls 31a and 31b may be referred to as first and second sidewalls, respectively. The sidewalls 31a and 31b are parallel to one another, and are substantially straight along the y-axis direction in the embodiment of FIG. 6A (with the term "substantially straight" meaning straight to within reasonable tolerances of fabrication and measurement).

Figure 6B:
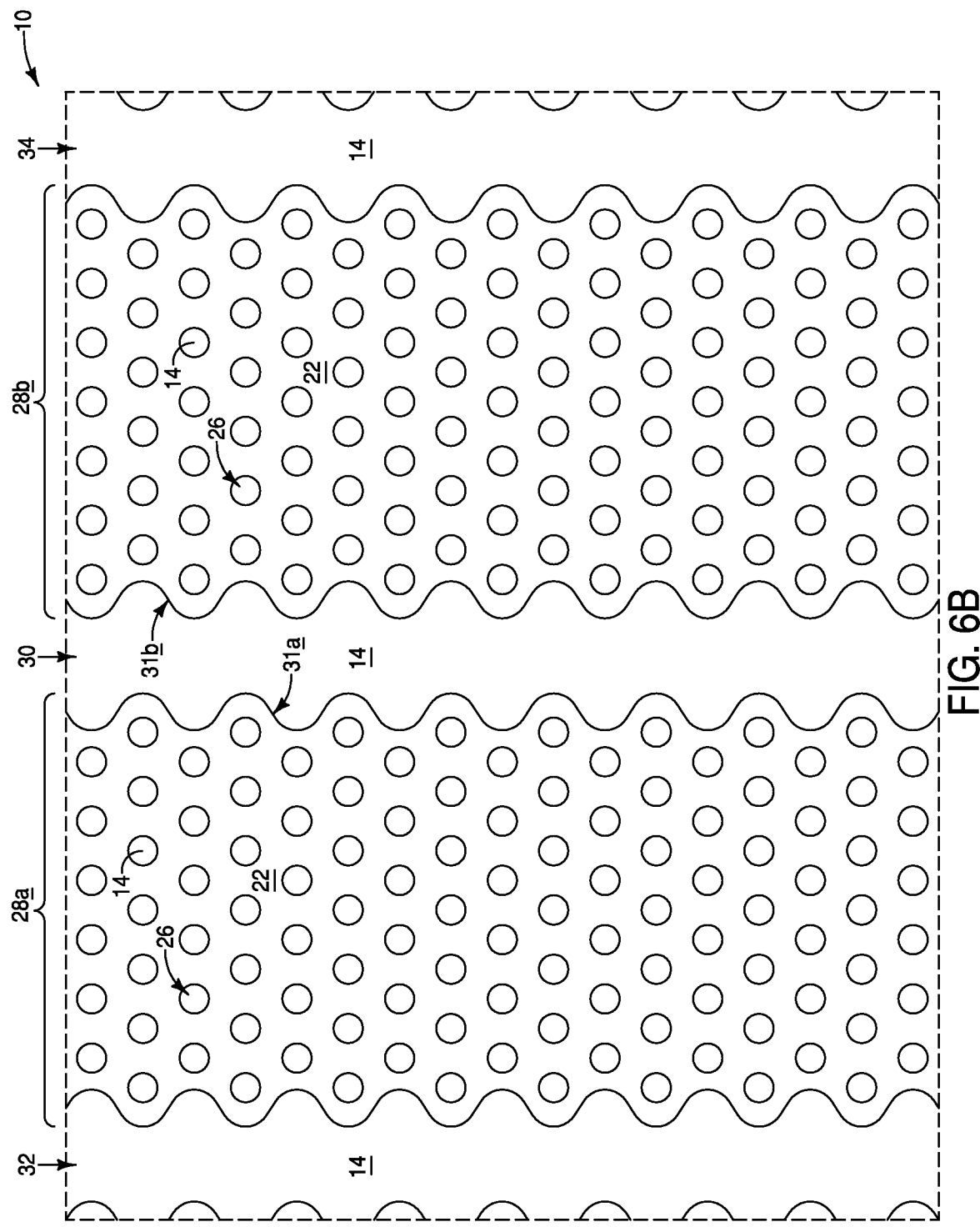
FIGS. 6B, 9B and 14B are diagrammatic top-down views of regions of integrated assemblies analogous to those of FIGS. 6A, 9A and 14A.
Figure 6C:
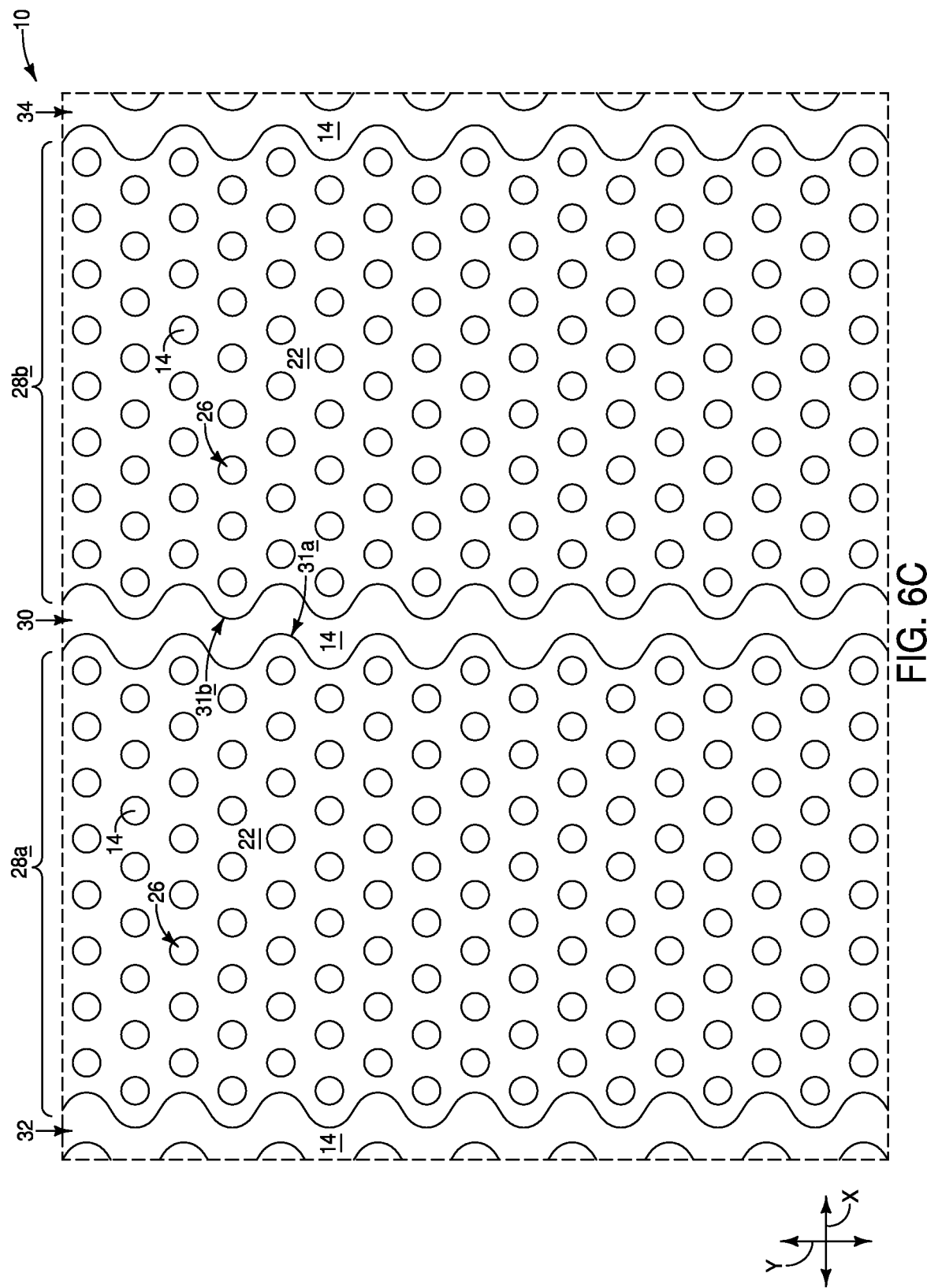
FIGS. 6C, 9C and 14C are diagrammatic top-down views of regions of integrated assemblies analogous to those of FIGS. 6A, 9A and 14A.

FIGS. 6B and 6C show embodiments analogous to that of FIG. 6A, but with the slit openings 30, 32 and 34 each having parallel sidewalls (e.g., sidewalls 31a and 31b of the slit opening 30) which have a serpentine (winding, wavy, weaving, etc.) configuration along the y-axis direction.

Figure 7:
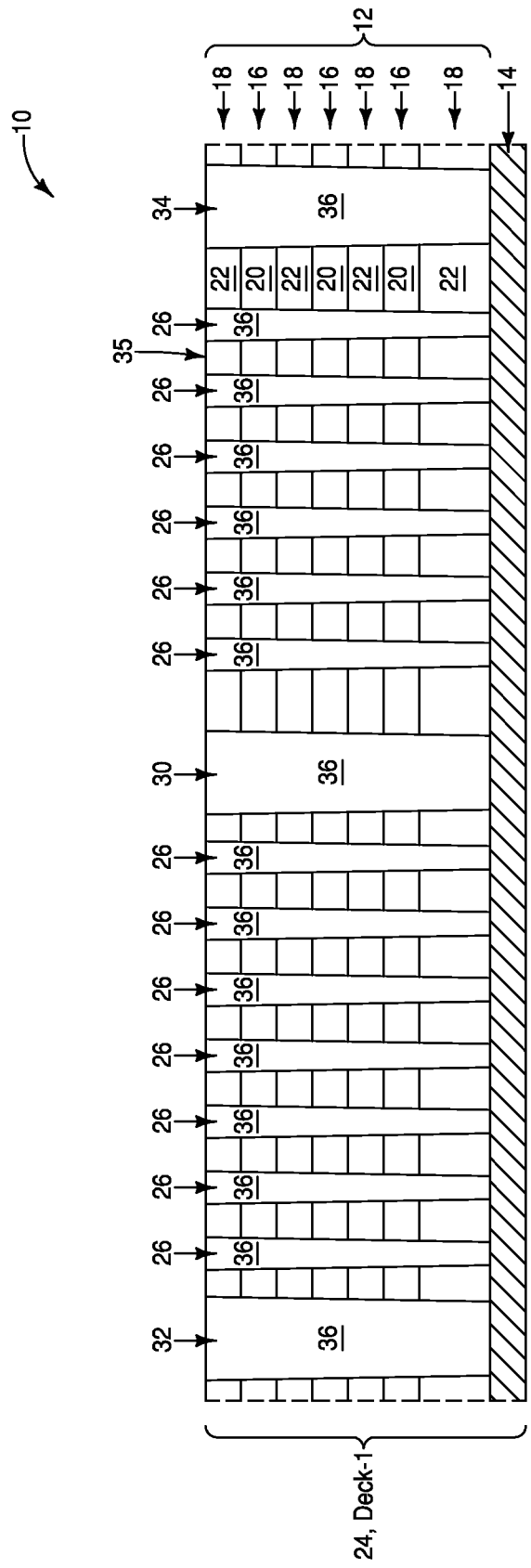

Referring to FIG. 7, sacrificial material 36 is formed within the openings 26, 30, 32 and 34. The sacrificial material 36 may comprise any suitable composition(s), and in some embodiments may comprise, consist essentially of, or consist of one or more of metal (e.g., tungsten), undoped semiconductor material (e.g., undoped silicon), carbon, aluminum oxide, etc.; with the term "undoped" meaning not significantly doped, and in some embodiments meaning a dopant concentration of less than or equal to about $1 \times 10^{16}$ atoms/cm$^3$. In some embodiments (not shown) the sacrificial material within the slits 30, 32 and 34 may be compositionally different than that within the pillar openings 26.

A planarized surface 35 is formed to extend across the sacrificial material 36 and the upper tier 18. The planarized surface 35 may be formed with any suitable processing, including, for example, chemical-mechanical polishing (CMP).

Figure 8:
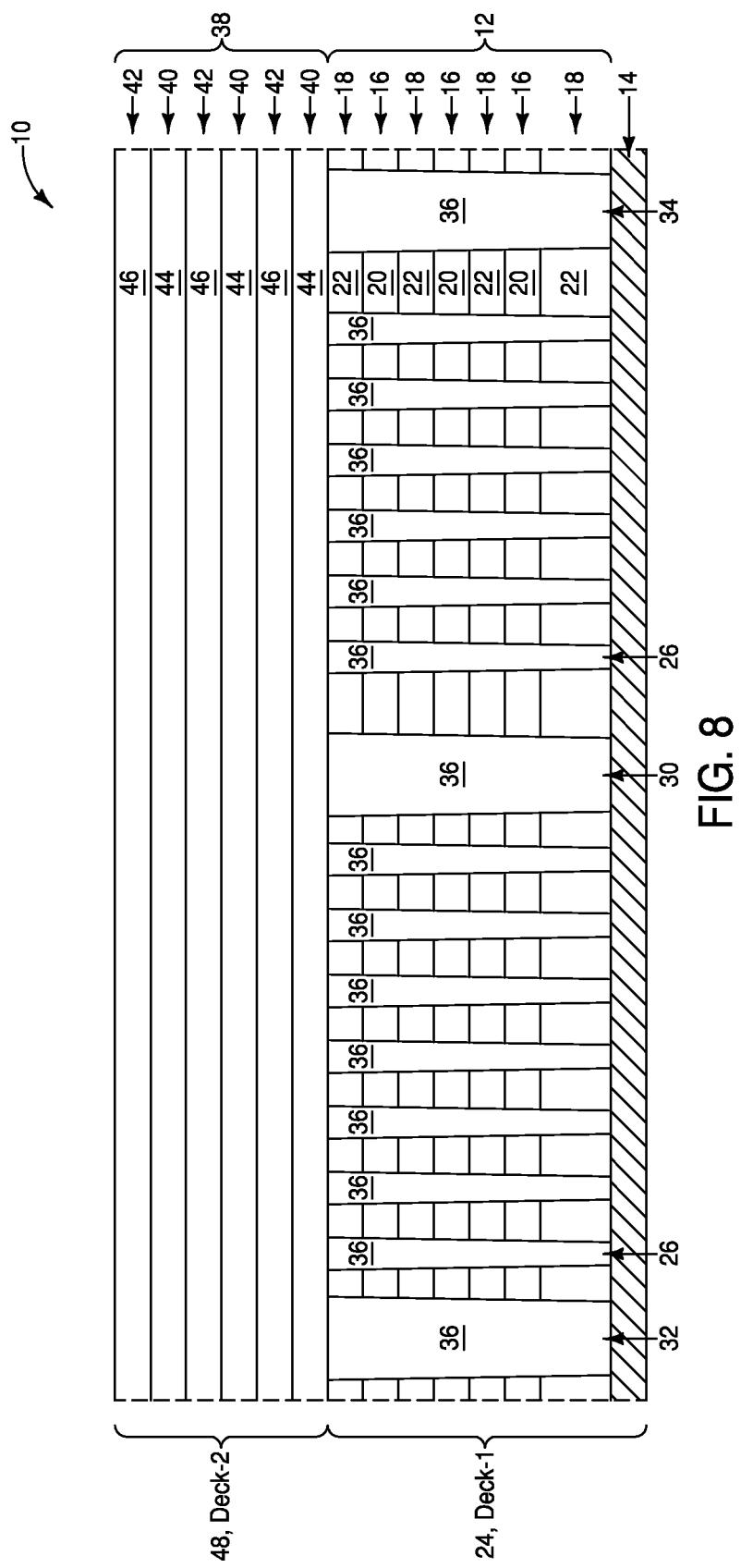

Referring to FIG. 8, a second stack 38 of alternating third and fourth tiers (levels, layers) 40 and 42 is formed over the first stack 12. The stack 38 may comprise any suitable number of alternating tiers 40 and 42. The tiers 40 ultimately become conductive levels of a memory arrangement. There may be any suitable number of tiers 40 to form the desired number of conductive levels. In some embodiments, the number of tiers 40 may be 8, 16, 32, 64, etc.

The third tiers 40 comprise a third material 44. Such third material may comprise any suitable composition(s), and in some embodiments may comprise, consist essentially of, or consist of silicon nitride. Accordingly, the third material 44 may comprise a same composition as the first material 20.

The fourth tiers 42 comprise a fourth material 46. Such fourth material may be an insulative material and may comprise any suitable composition(s). In some embodiments, the fourth material 46 may comprise, consist essentially of, or consist of silicon dioxide. In some embodiments, the insulative fourth material 46 may comprise a same composition as the insulative second material 22.

The tiers 40 and 42 may have the same thicknesses described above relative to the tiers 16 and 18, or may have different thicknesses than the tiers 16 and 18.

The second stack 38 may be considered to be comprised by a second deck 48 (Deck-2).

Referring to FIG. 9, second pillar openings 50 are formed to extend through the second stack 38 to the sacrificial material 36 within the first pillar openings 26. Also, slit openings 52, 54 and 56 are formed to extend through the second stack 38 to the sacrificial material 36 within the slit openings 30, 32 and 34, respectively. In some embodiments, the slit opening 52 between the memory-block-regions 28a and 28b may be referred to as a second slit opening, and such may be considered to extend through the second stack 38 to the first slit opening 30.

An inter-deck region 58 is diagrammatically indicated in FIG. 9 as a region where the decks 24 and 48 interface with one another. The openings 50 and 26 together form first inter-deck inflections 60 (only one of which is labeled in FIG. 9) where they join. The slit openings 52 and 30 together form a second inter-deck inflection 62 where they join. Similarly, the slit openings 54 and 32 together form an inter-deck inflection 62 where they join, and the slit openings 56 and 34 together form an inter-deck inflection 62 where they join.

Figure 9A:
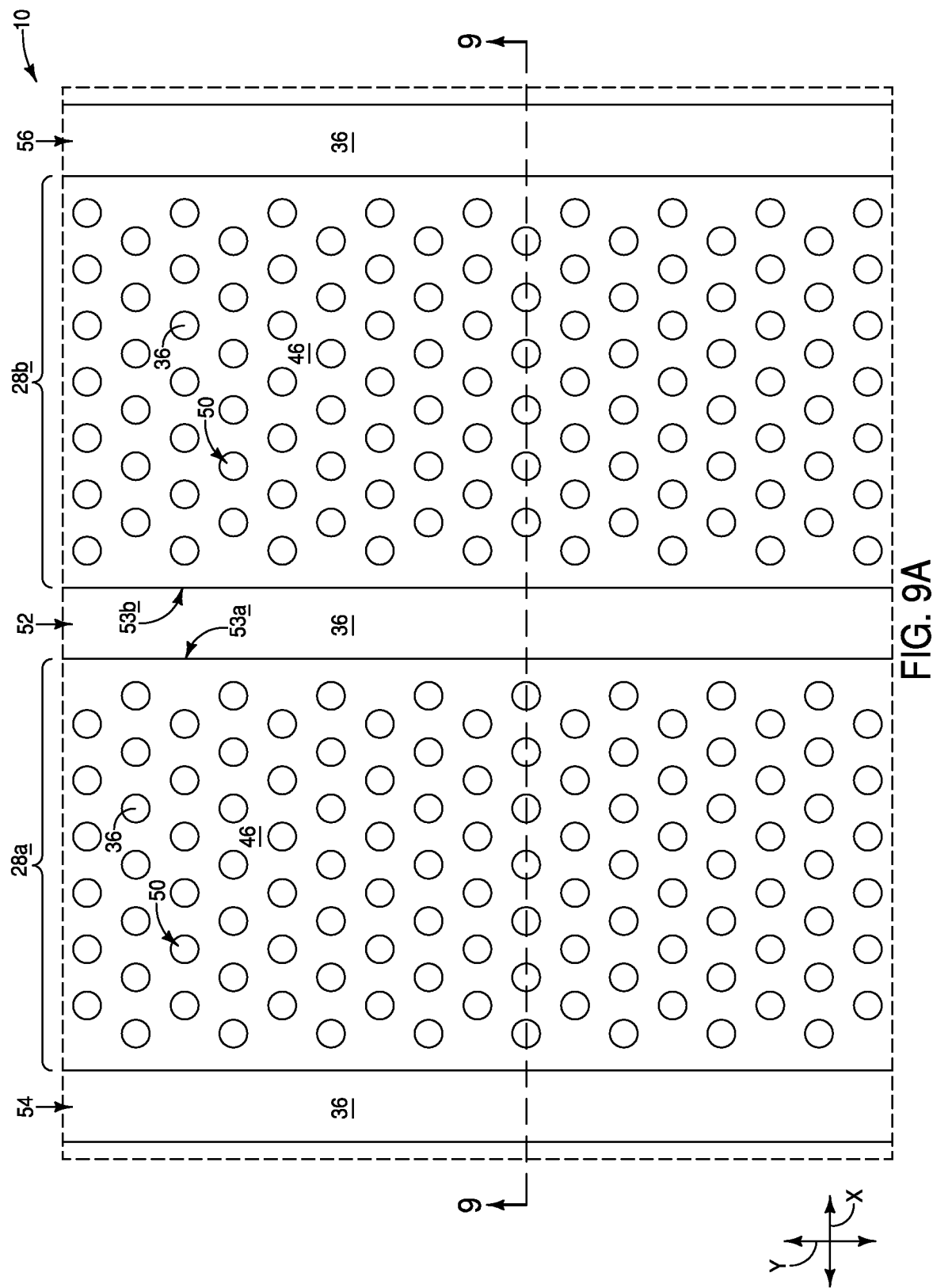
Figure 9B:
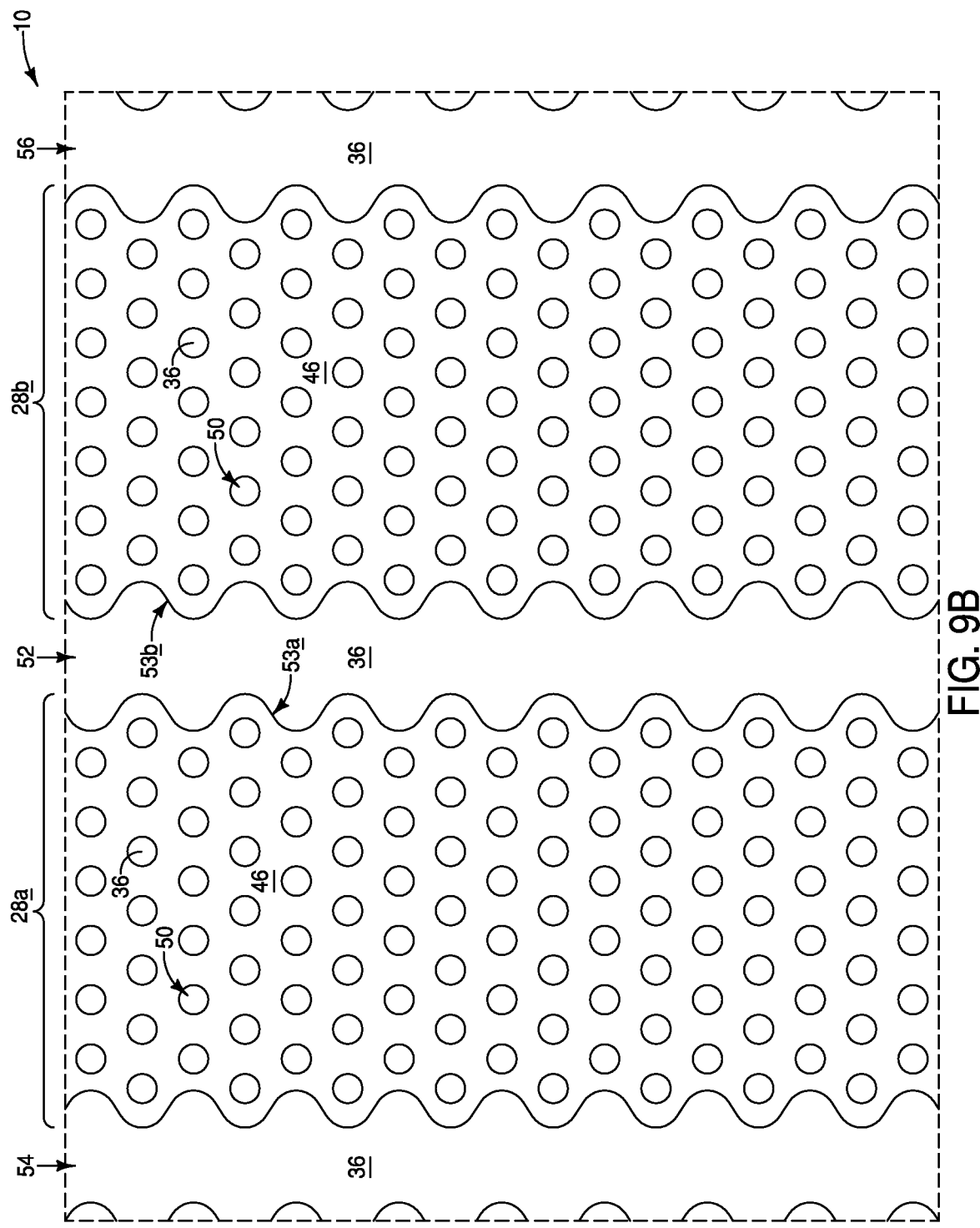
Figure 9C:
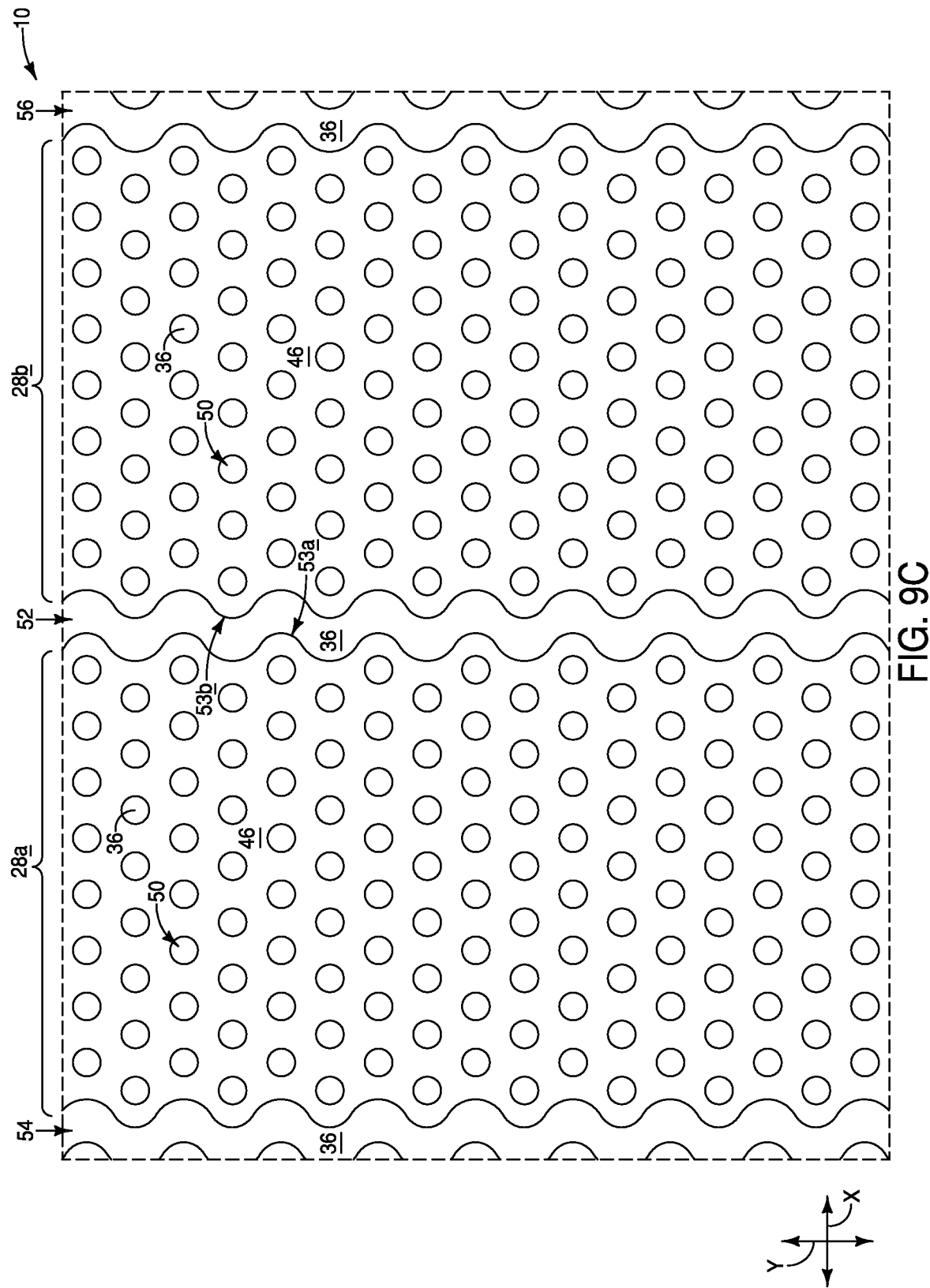
Figure 9D:
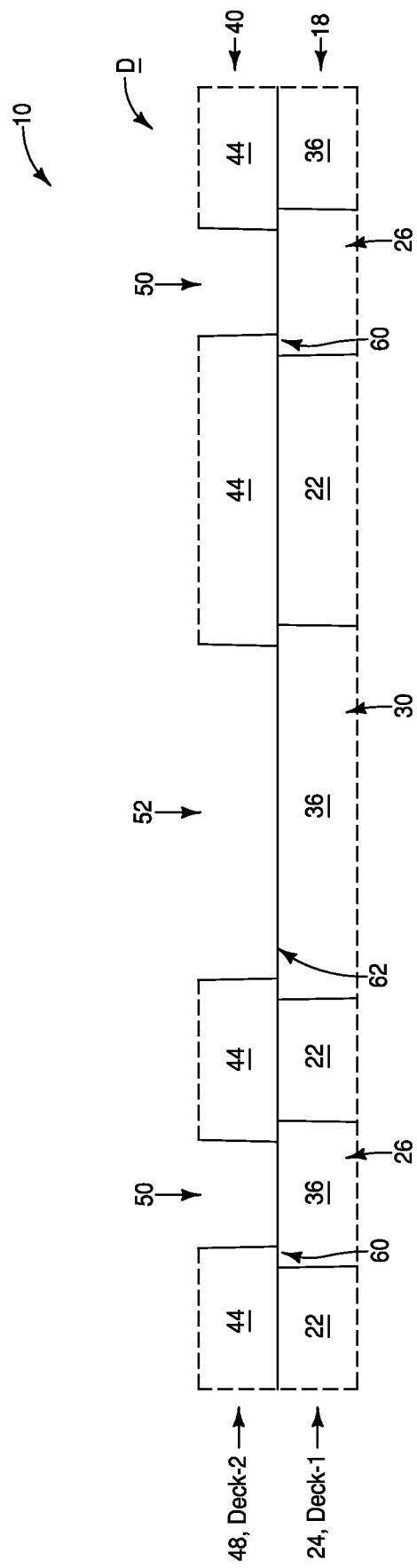
FIG. 9D is an enlarged diagrammatic cross-sectional side view of a region "D" of FIG. 9.

FIG. 9D shows an enlarged view of a region D along the inter-deck region 58 to more clearly illustrate some of the example inter-deck inflections 60 and 62. The illustrated inter-deck inflections 60 occur where the pillar openings 50 (the pillar openings formed through the second deck 48) meet the pillar openings 26 (the pillar openings formed through the first deck 24), and are a result of having the first and second pillar openings tapered during formation of such openings. Accordingly, the inflections 60 occur where a narrow lower portion of the tapered opening 50 joins to a wide upper portion of the tapered opening 26.

The illustrated inter-deck inflections 62 are similar to the inflections 60, and occur where the narrow lower portions of the tapered slit openings (e.g., 52) of the upper deck meet the wide upper portions of the tapered slit openings (e.g., 30) of the lower deck.

FIGS. 9 and 9D show examples of inter-deck inflections that may be detected in in an inter-deck region. The inter-deck inflections result from one portion of a configuration being formed during fabrication associated with the lower deck and another portion of the configuration being formed during fabrication associated with the upper deck. In other embodiments, the inter-deck inflections may have other manifestations than are shown in FIGS. 9 and 9D. For instance, the inter-deck inflections may correspond to regions where an opening through an upper deck is offset relative to an opening through a lower deck (e.g., through mask misalignment during formation of the opening). In some embodiments, one or more of the openings 26, 30, 32, 34, 50, 52, 54 and 56 may not have the shown tapering.

FIG. 9A shows that the slit openings 52, 54 and 56 extend along the illustrated y-axis direction. Each of the slit openings has a pair of opposing sidewalls, with the sidewalls of the slit opening 52 being labeled 53a and 53b. The sidewalls 53a and 53b may be referred to as first and second sidewalls, respectively. The sidewalls 53a and 53b are parallel to one another, and are substantially straight along the y-axis direction in the embodiment of FIG. 9A.

FIGS. 9B and 9C show embodiments analogous to that of FIG. 9A, but with the slit openings 52, 54 and 56 having parallel sidewalls (e.g., sidewalls 53a and 53b of the slit opening 52) which each have a serpentine (winding, wavy, weaving, etc.) configuration along the y-axis direction.

Figure 10:
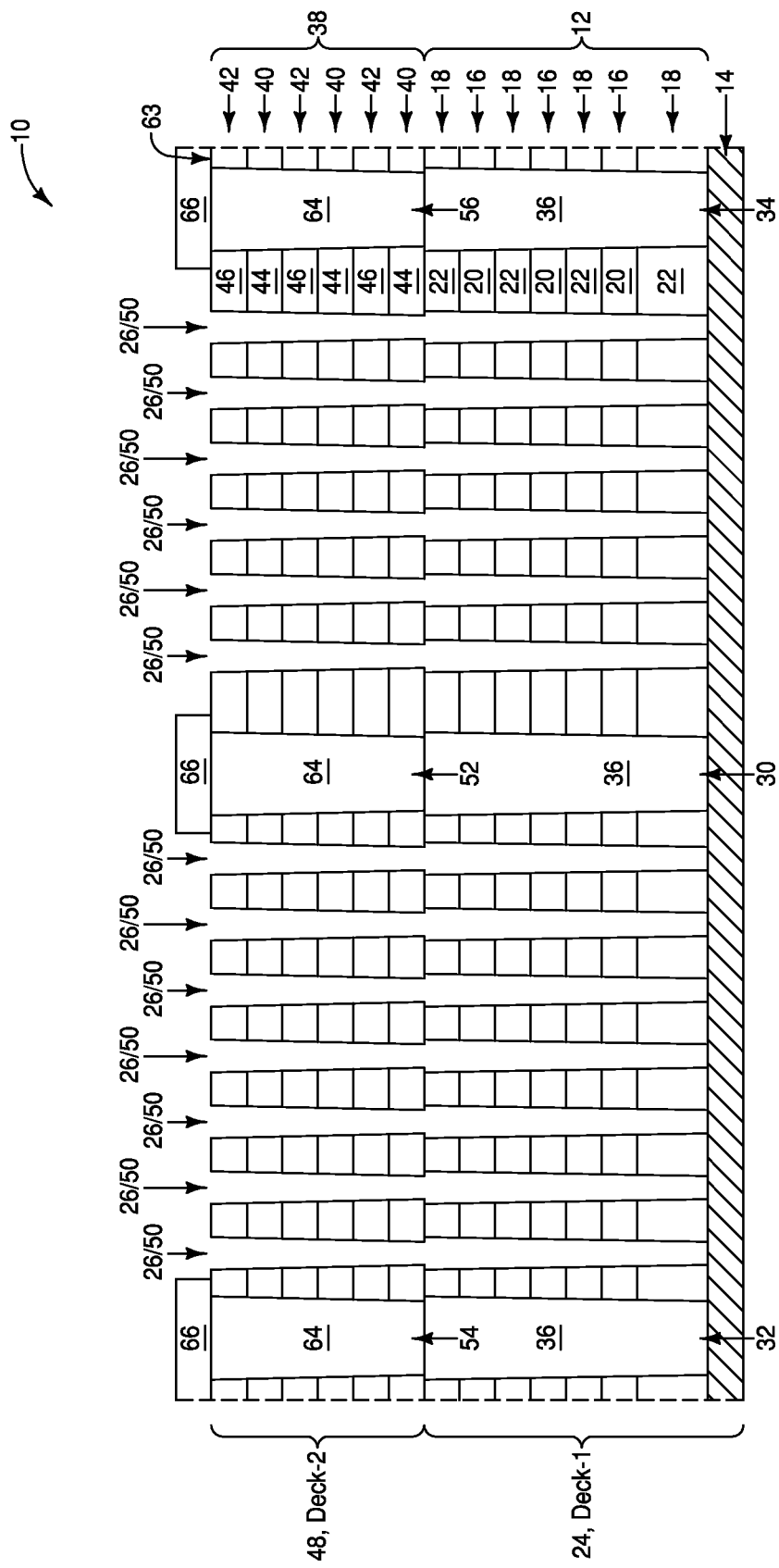

Referring to FIG. 10, additional sacrificial material 64 is formed within the slit openings 52, 54 and 56; patterned masking material 66 is provided along a top surface of the assembly 10 to protect the sacrificial materials 36 and 64 within the slit openings 30, 32, 34, 52, 54 and 56; and subsequently the sacrificial material 36 is removed from within the pillar openings 26. The pillar openings 26 and 50 within the upper and lower decks 24 and 48 merge to form vertically-extending pillar openings 26/50 which extend entirely through both of the first and second decks 24 and 48.

In some embodiments, the sacrificial material 64 may be formed within the second pillar openings 50 (FIG. 9) as such sacrificial material is formed within the slit openings 52, 54 and 56; a planarized surface 63 may be formed to extend across the sacrificial material 64 and the upper tier 42; the patterned masking material 66 may be formed on such planarized surface 63; and then the sacrificial materials 36 and 64 may be removed from the pillar openings to leave the resulting configuration of FIG. 10 having vertically-extending openings 26/50 extending entirely through the decks 24 and 48 (i.e., extending entirely through the stacks 12 and 38).

The patterned mask 66 may comprise any suitable composition(s), and in some embodiments may comprise photolithographically-patterned photoresist.

The sacrificial material 64 may comprise any suitable composition(s), and in some embodiments may comprise a same composition as the sacrificial material 36.

Figure 11:
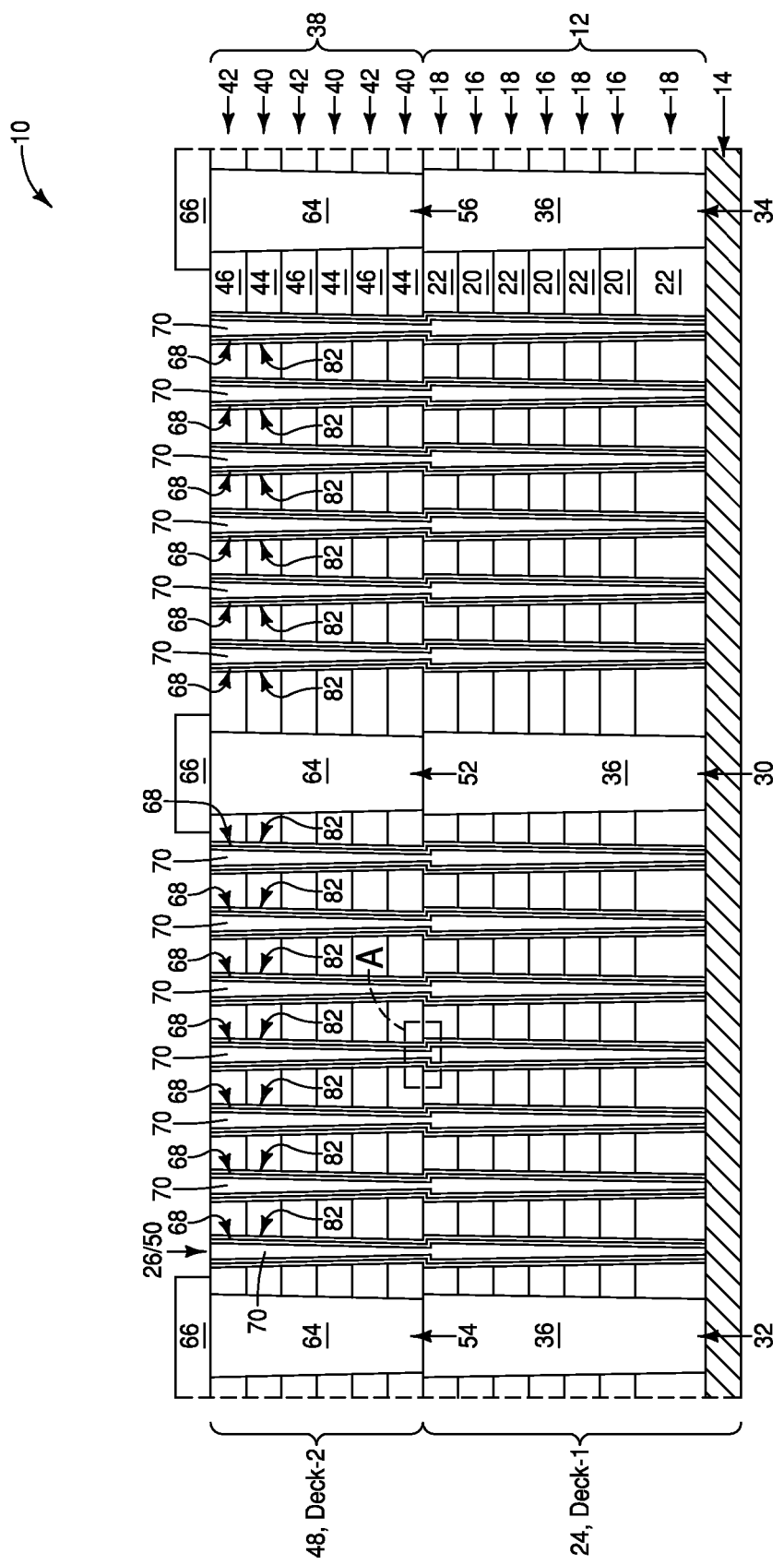

Referring to FIG. 11, channel-material-pillars 68 are formed within the openings 26/50. The masking material 66 may or may not remain over the slit regions as the channel-material-pillars are formed, and in the shown embodiment of FIG. 11 remains over such slit regions.

The channel-material-pillars 68 may be considered to extend vertically through the first and second decks 24 and 48, and are shown to be electrically coupled with the conductive structure 14 (and in the shown embodiment are directly against the conductive structure 14). The channel-material-pillars 68 are shown to be hollow, and to laterally surround insulative material 70. The channel material-pillars 68 are offset from edges of the openings 26/50 by regions comprising cell materials.

The channel-material-pillars and cell materials are shown in more detail relative to an enlarged view of FIG. 11A. The channel-material-pillars 68 comprise channel material 72. The channel material 72 may comprise any suitable semiconductor composition(s). In some embodiments, the channel material 72 may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the channel material 72 may comprise silicon. The silicon may be in any suitable crystalline state (e.g., monocrystalline, polycrystalline, amorphous, etc.).

The channel material 72 is offset from the edge of the opening 26/50 by a region 74 comprising cell materials. The cell materials within the region 74 may include gate-dielectric material (insulative material, tunneling material) 76, charge-storage material 78, and charge-blocking material 80.

The gate-dielectric material 76 may comprise any suitable composition(s); and in some embodiments may comprise one or more of silicon dioxide, silicon nitride, aluminum oxide, hafnium oxide, zirconium oxide, etc. In some embodiments, the material 76 may comprise a bandgap-engineered laminate.

The charge-storage material 78 may comprise any suitable composition(s), and in some embodiments may comprise charge-trapping material (e.g., one or more of silicon nitride, silicon oxynitride, conductive nanodots, etc.).

The charge-blocking material 80 comprise any suitable composition(s), and in some embodiments may comprise one or both of silicon dioxide and silicon oxynitride.

The insulative material 70 may comprise any suitable composition(s), and in some embodiments may comprise, consist essentially of, or consist of silicon dioxide. In some embodiments, the insulative material 70 may be omitted and the channel-material-pillars 68 may be solid pillars rather than being the illustrated hollow pillars.

In some embodiments, the materials 72, 76, 78 and 80 may be considered together to form cell-material-pillars 82. In other words, the cell-material-pillars 82 may be considered to comprise the channel-material-pillars 68 together with the cell materials 76, 78 and 80.

Figure 12:
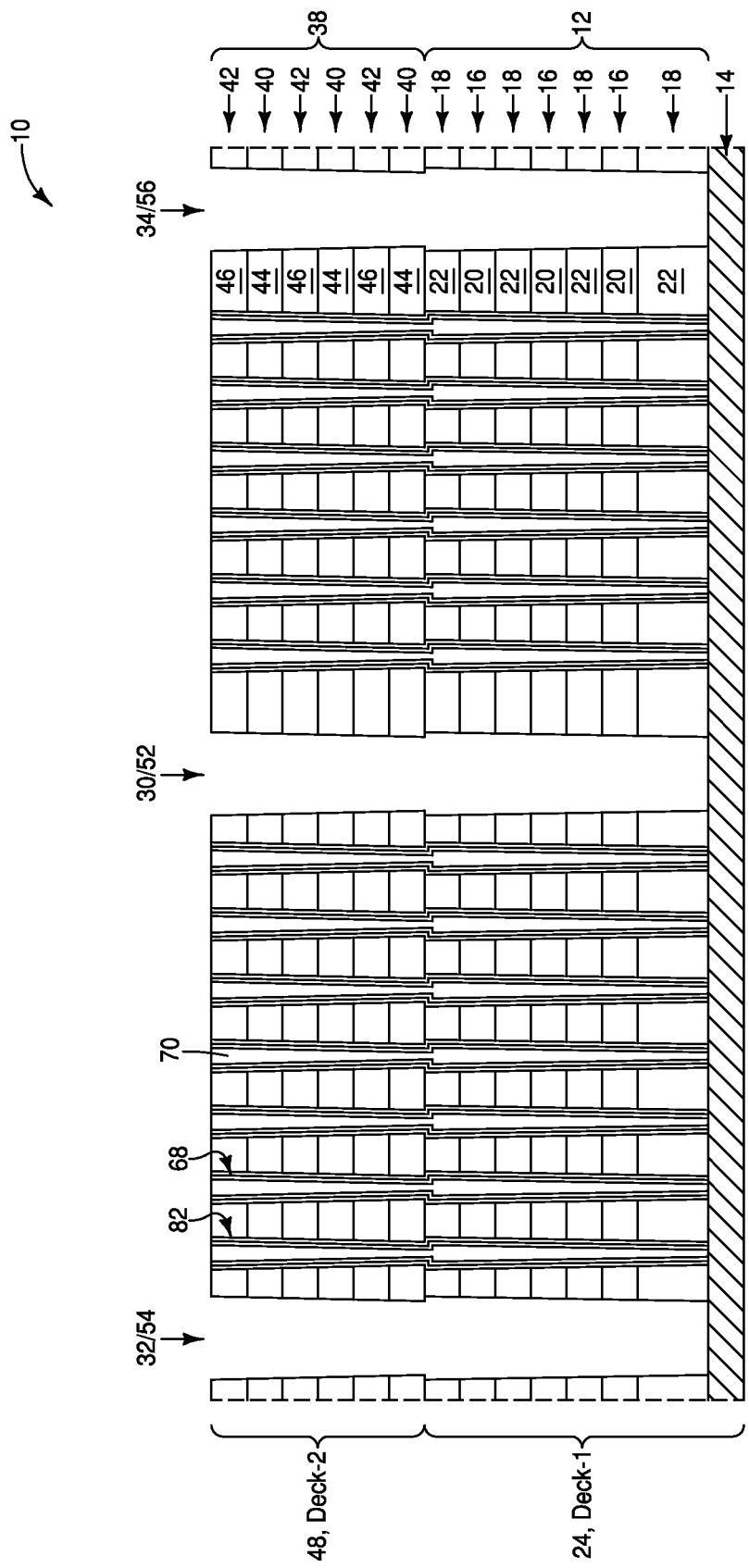

Referring to FIG. 12, the masking material 66 (FIG. 11) is removed together with the sacrificial materials 36 and 64 within the slit regions to leave slit openings 32/54, 30/52 and 34/56 extending through the decks 24 and 48 (i.e., through the stacks 12 and 38).

Figure 13:
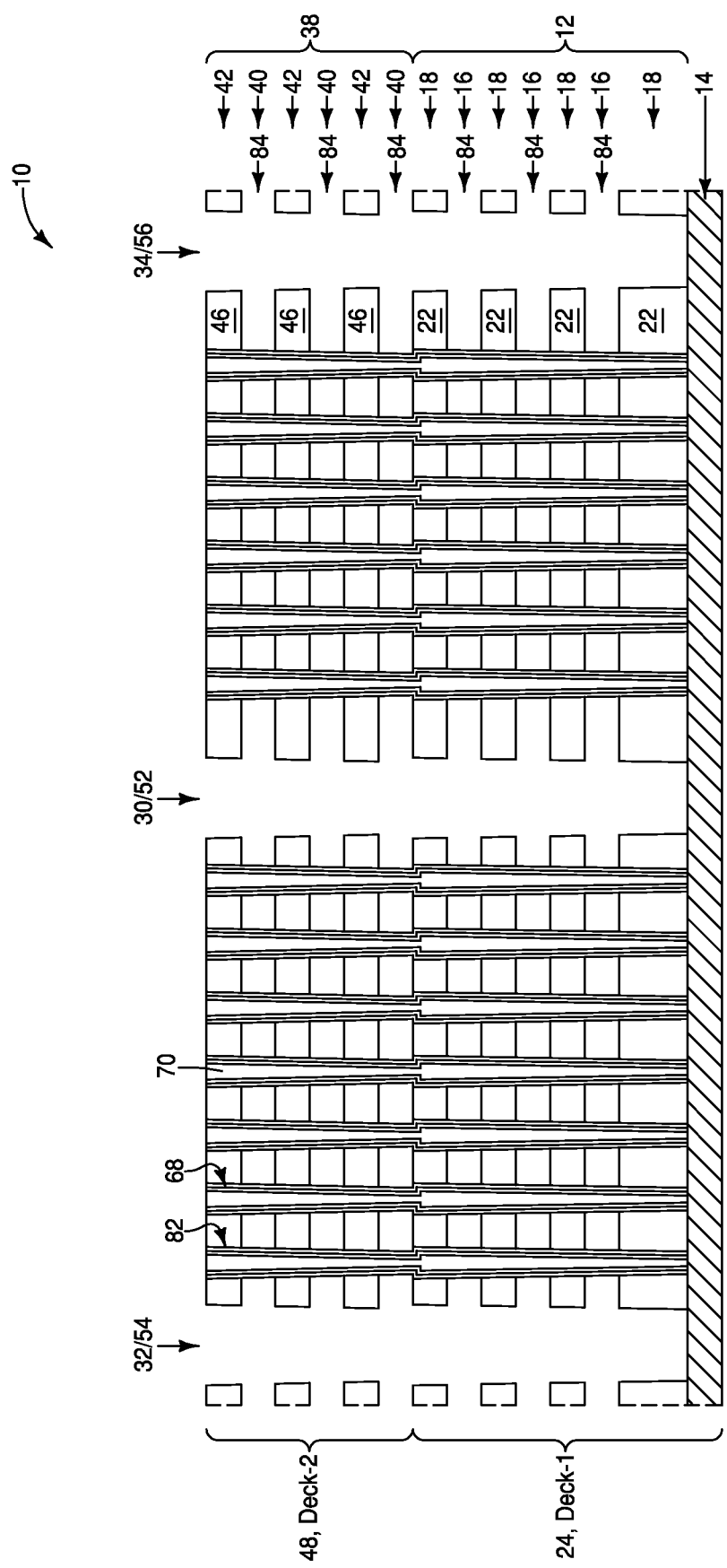

Referring to FIG. 13, etchant (not shown) is flowed into the slit openings 32/54, 30/52 and 34/56, and is utilized to remove the materials 20 and 44 (shown in FIG. 12) to form voids 84 along the levels 16 and 40.

Figure 14:
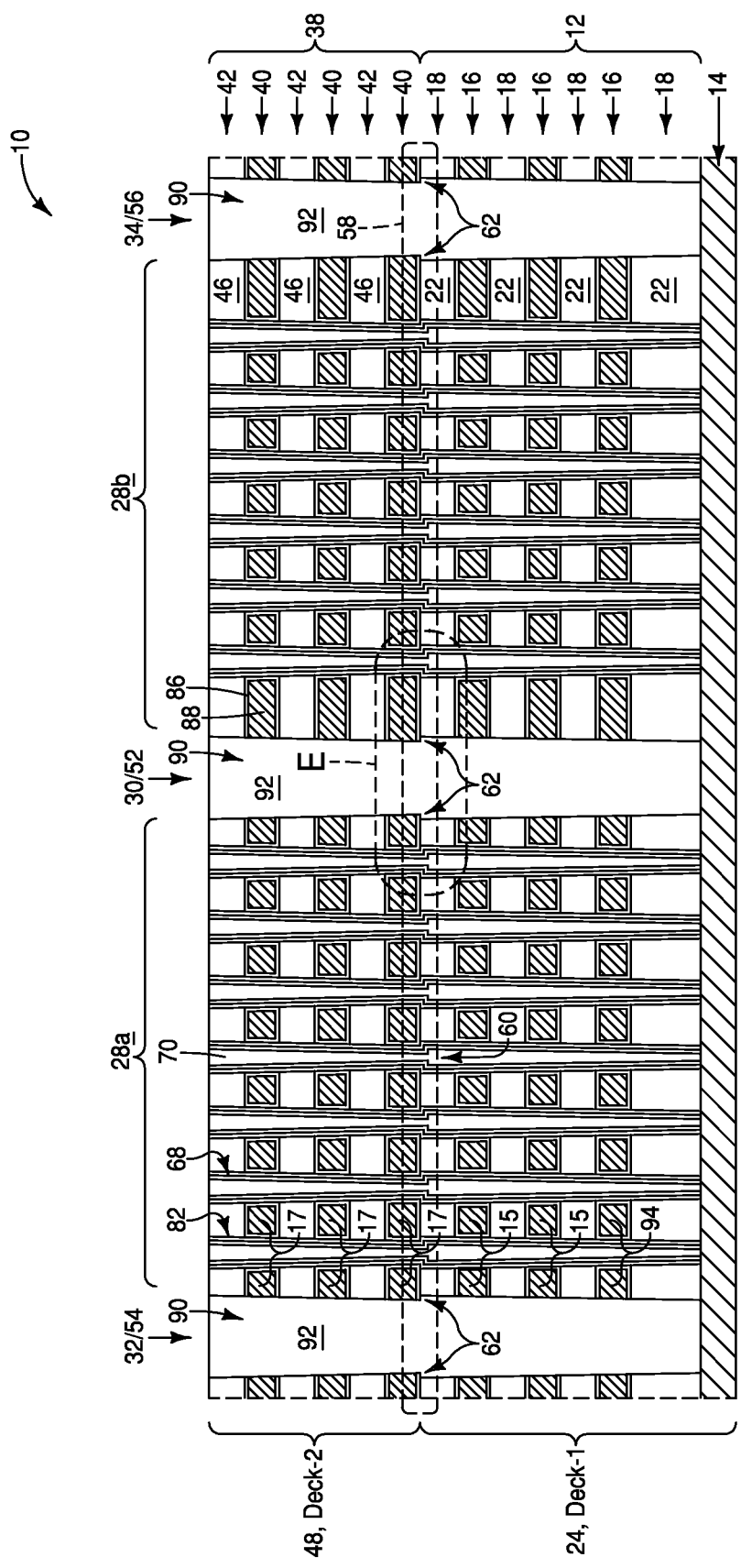

Referring to FIG. 14, dielectric-barrier material 86 is formed within the voids 84 (FIG. 13) to line the voids, and then conductive material 88 is formed within the lined voids.

The dielectric-barrier material 88 may comprise any suitable composition(s); and may, for example, comprise one or more high-k compositions (e.g., aluminum oxide, hafnium oxide, zirconium oxide, etc.). The term "high-k composition" means a composition having a dielectric constant greater than the dielectric constant associated with silicon dioxide (i.e., greater than about 3.9). In some embodiments, the dielectric-barrier material 86 may be formed within the openings 26/50 (FIGS. 11 and 11A) as one of the cell materials within the regions 74 (FIG. 11A) in addition to, or alternatively to, being formed within the voids 84.

The conductive material 88 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 88 may comprise a metal-containing core (e.g., a tungsten-containing core), and a metal nitride (e.g., titanium nitride, tungsten nitride, etc.) along a periphery of the metal-containing core. In some embodiments, the conductive material 88 may be considered to be configured as wordlines along the conductive levels 16 and 40, and may be referred to as conductive wordline material.

The alternating levels 16 and 18 of the first stack 12 may be referred to as first conductive levels and first insulative levels, respectively; and the alternating levels 40 and 42 of the second stack 38 may be referred to as second conductive levels and second insulative levels, respectively.

The processing of FIGS. 13 and 14 may be considered to replace at least some of the first and third materials 20 and 44 (FIG. 12) with one or more conductive materials (e.g., the conductive material 88) to form the first and second conductive levels 16 and 40 of FIG. 14.

After the materials 86 and 88 are formed within the voids 84 (FIG. 13), panels 90 are formed within the slit openings 32/54, 30/52 and 34/56. The panels 90 may comprise any suitable composition(s). In the shown embodiment, the panels 90 comprise a homogeneous insulative composition 92. Such composition may, for example, comprise, consist essentially of, or consist of silicon dioxide. In other embodiments, the panels may comprise laminates of two or more compositions, and at least one of such compositions may be conductive.

First memory cells 15 (only some of which are labeled) are along the first conductive levels 16 of the first deck 24, and second memory cells 17 (only some of which are labeled) are along the second conductive levels 40 of the second deck 48. Each of the first and second memory cells includes a portion of a channel-material-pillar 68, portions of the memory cell materials adjacent the channel-material-pillar (with the memory cell materials being described above with reference to FIG. 11A), and portions of the conductive levels. The memory cells 15 and 17 along the pillars 82 may correspond to vertical strings of memory cells suitable for utilization in NAND memory of the types described above with reference to FIGS. 1-4.

The bottom conductive level 16 of the first deck 24 is shown to comprise source-side select gate (SGS) devices 94 rather than comprising memory cells. In some embodiments, more than one of the conductive levels may be incorporated into the SGS devices. If multiple conductive levels are incorporated into the SGS devices, the conductive levels may be electrically ganged together.

The first memory cells 15 may be considered to be arranged in first tiers (the levels 16), with such first tiers being disposed one atop another and being comprised by the first deck 24. The second memory cells 17 may be considered to be arranged in second tiers (the levels 40), with such second tiers being disposed one atop another and being comprised by the second deck 48.

The cell-material-pillars 82 (and the memory cells 15 and 17 associated with such pillars) are arranged within a configuration that includes the first and second memory-block-regions 28*a* and 28*b*.

The inter-deck region 58 is diagrammatically indicated in FIG. 14 as the region where the decks 24 and 48 interface with one another. The first and second inter-deck inflections 60 and 62 are shown in FIG. 14, with the first inter-deck inflections being along the cell-material-pillars 82, and the second inter-deck inflections being along the panels 90. In some embodiments, the first inter-deck inflections 60 may be considered to be associated with a boundary between the first and second decks 24 and 48, and to be within the cell-material-pillars 82; and the second inter-deck inflections 62 may be considered to be associated with the boundary between the first and second decks, and to be within the panels 90. The inter-deck inflections may result from the openings being formed in the top and bottom decks in separate process stages, as described in more detail above with reference to FIGS. 9 and 9D. FIG. 14E shows an enlarged view of a region E along the inter-deck region 58 to more clearly illustrate representative inter-deck inflections 60 and 62.

Figure 14A:
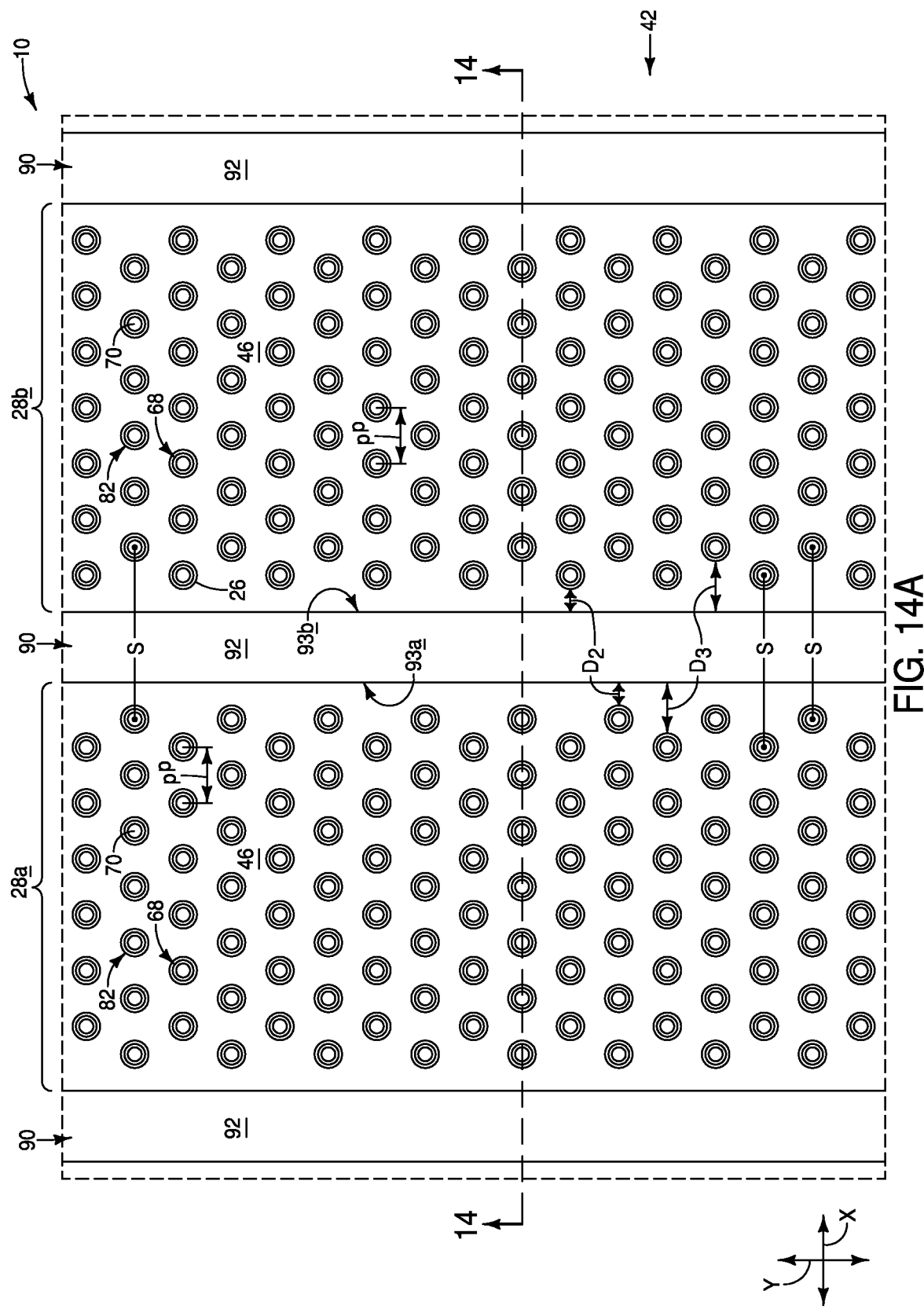

The top-down view of FIG. 14A shows that the panels 90 extend along the horizontal direction corresponding to the illustrated y-axis direction. Each of the panels has a pair of opposing sidewalls, with the sidewalls of the central panel being labeled 93*a* and 93*b*. The sidewalls 93*a* and 93*b* may be referred to as first and second sidewalls, respectively. The sidewalls 93*a* and 93*b* are parallel to one another, and are substantially straight along the y-axis direction in the embodiment of FIG. 14A.

Figure 14B:
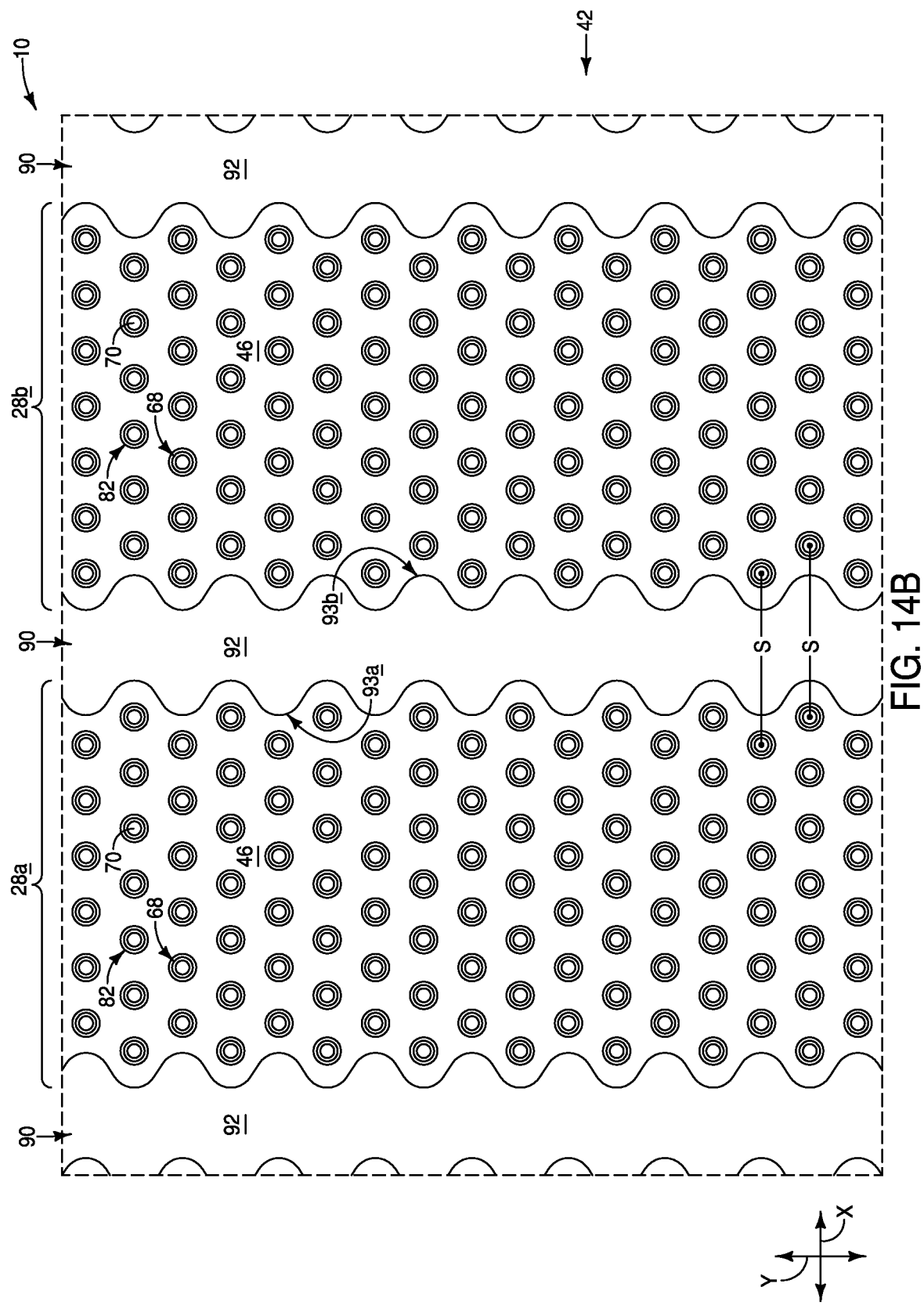
Figure 14C:
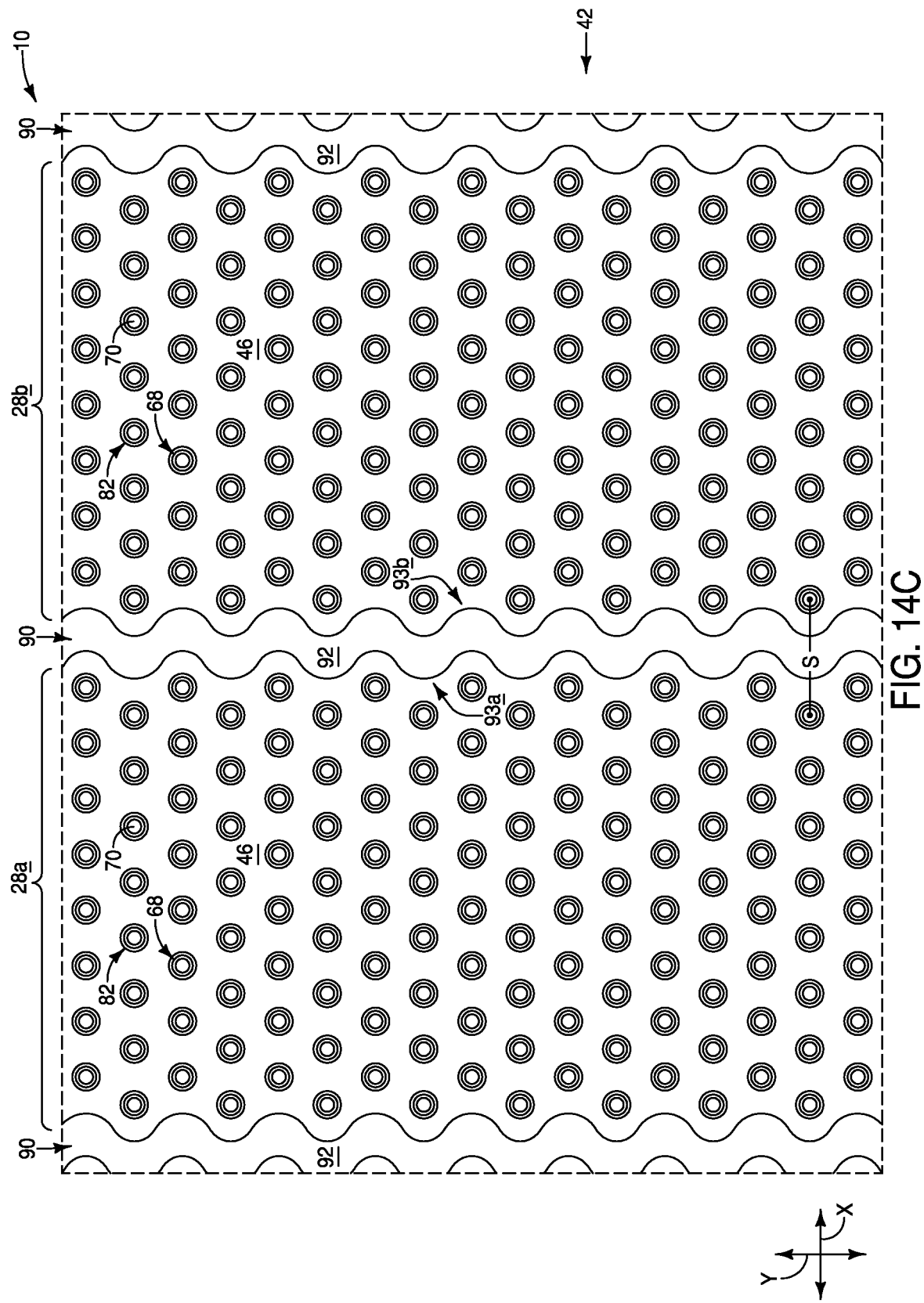

FIGS. 14B and 14C show embodiments analogous to that of FIG. 14A, but with the panels having parallel sidewalls (e.g., sidewalls 93*a* and 93*b* of the central panel 90) which each have a serpentine (winding, wavy, weaving, etc.) configuration along the y-axis direction.

An advantage of the serpentine sidewall configurations of FIGS. 14B and 14C is that such may enable the panel sidewalls to maintain a uniform distance relative to neighboring edges of cell-material-pillars. Such advantage is described in more detail relative to FIG. 14D, which shows a top-down cross-section through one of the conductive levels 40 (the dielectric material 86 is not shown in FIG. 14D to simplify the drawing). The cell-material-pillars 82 within the first memory-block-region 28*a* may be considered to include a first set 96 of the cell-material-pillars 82 which are those pillars that are neighboring to the sidewall 93a of the central panel 90 (i.e., the panel what separates the memory-block-region 28a from the memory-block-region 28b). Analogously, the cell-material-pillars 82 within the second memory-block-region 28b may be considered to include a second set 98 of the cell-material-pillars 82 which are those pillars that are neighboring to the sidewall 93b of the central panel 90. The pillars 82 within the first set 96 have neighboring edges 95 (only some of which are labeled) adjacent the sidewall 93a of the central panel 90, and the pillars 82 of the second set 98 have neighboring edges 97 adjacent the sidewall 93b of the central panel 90. The serpentine configuration of the sidewalls 93a and 93b advantageously may enable the sidewalls 93a and 93b of the panel 90 to be maintained at a substantially uniform distance $D_1$ from the neighboring edges 95 and 97 of the pillars 82 within the sets 96 and 98. In contrast, the straight sidewalls of the embodiment of FIG. 14A have varying distances $D_2$ and $D_3$ from neighboring edges of neighboring pillars 82. Such varying distances may problematically lead to nonuniformity of device performance (e.g., memory cell performance) due to, for example, nonuniform resistances along the pillars 82 resulting from differing sizes of segments of conductive wordline material 88 between the pillars and the sidewalls of the panels 90. In some embodiments, problems associated with the straight panel sidewalls of the embodiment of FIG. 14A may be alleviated, and even prevented, utilizing weaving panel sidewalls of the types shown in the embodiments of FIGS. 14B-D.

Figure 14D:
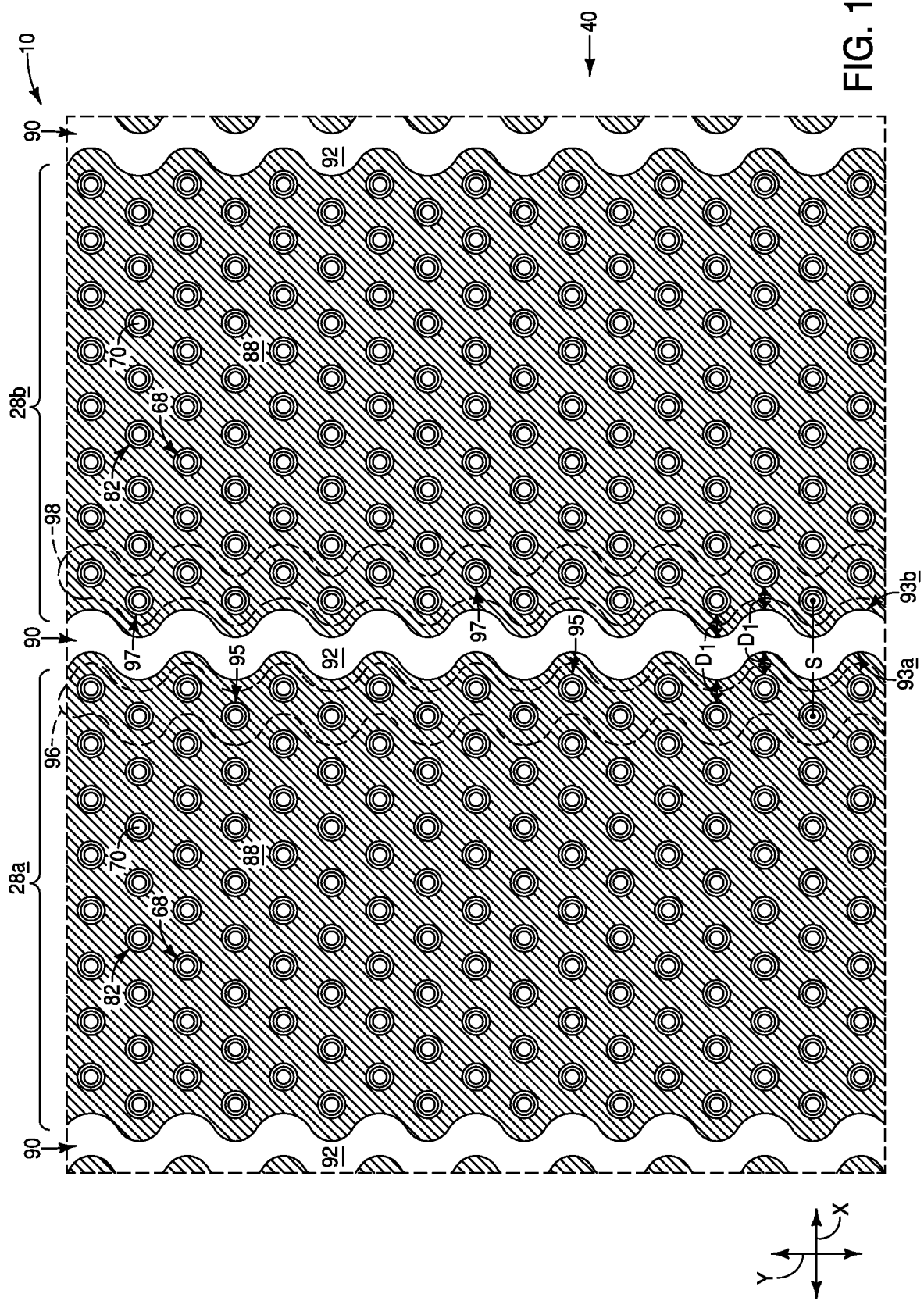
FIG. 14D is a diagrammatic top-down view of a region of the integrated assembly of FIG. 14C, and is through a different level than the view of FIG. 14C.
Figure 14E:
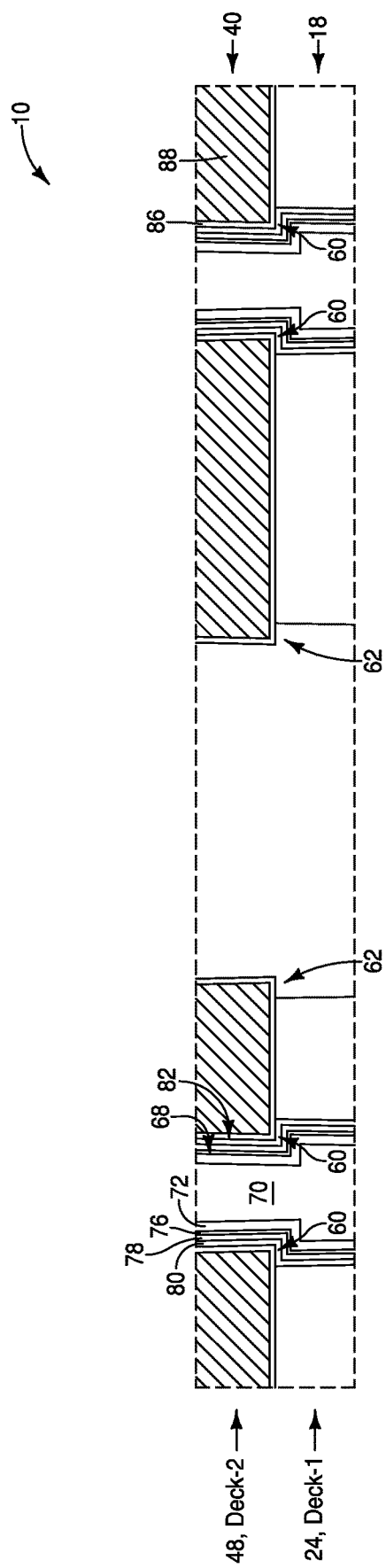
FIG. 14E is an enlarged diagrammatic cross-sectional side view of a region "E" of FIG. 14.

Another advantage of the serpentine sidewall configurations of FIGS. 14B-14D may be that such can enable the memory blocks 28a and 28b to be more tightly-packed than is possible with the straight sidewalls of FIG. 14A.

Referring initially to FIG. 14A, a center-to-center spacing S between a pillar 82 within the memory-block-region 28a and an adjacent pillar 82 within the memory-block-region 28b may be expressed in terms of a pillar pitch (pp), with the pillar pitch being a center-to-center distance between adjacent pillars in the memory-block regions 28a and 28b. In some embodiments, the straight-sidewall panel configuration of 14A will lead to spacing distances (S) of at least about 3.5 pp. In contrast, the weaving-sidewall panel configurations of FIGS. 14B-D may lead to spacing distances (S) of less than or equal to about 3 pp, less than or equal to about 2.5 pp, and even less than or equal to about 2 pp.

The embodiments described above show two decks (24 and 48) stacked one on top of the other. In some applications, analogous embodiments may be applied to configurations having more than two decks stacked one on top of another.

The formation of the first regions of the slit openings (30, 32 and 34) and pillar openings (26) within the first deck 24, followed by the formation of the second regions of the slit openings (52, 54 and 56) and pillar openings (50) within the second deck 48 may enable the overall slit openings (30/52, 32/54 and 34/56) and overall pillar openings (26/50) to be formed with more uniformity than could be achieved by attempting to etch the slit openings and pillar openings through the first and second decks 24 and 48 in a single step, and may lead to better critical dimensions (e.g., less tapering) than would occur if the slit openings and pillar openings were etched through the first and second decks in a single step. However, it is to be understood that some embodiments may include formation of at least some of the openings through multiple decks in a single step, rather than forming portions of the openings within each of the decks in separate etch steps. For instance, FIGS. 15-18 illustrate an example embodiment in which the pillar openings are formed within multiple decks utilizing separate etch steps, and in which the slit openings are formed through the multiple decks with a single etch step.

Figure 15:
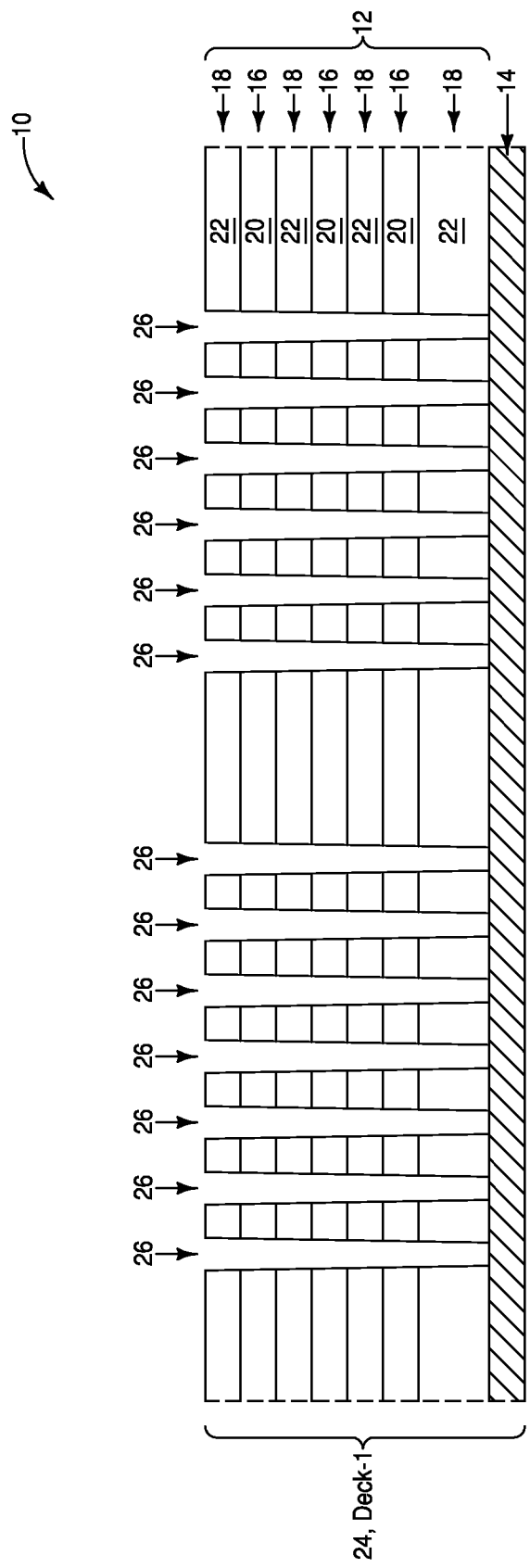
FIGS. 15-18 are diagrammatic cross-sectional side views of a region of an integrated assembly at example sequential process stages of an example method for forming an example memory array. The process stage of FIG. 15 may follow that of FIG. 5 in some embodiments.

Referring to FIG. 15, the assembly 10 is shown at a process stage analogous to that of FIG. 6, except only the pillar openings 26 are formed within the first deck 24 rather than also forming the slit openings within the first deck.

Figure 16:
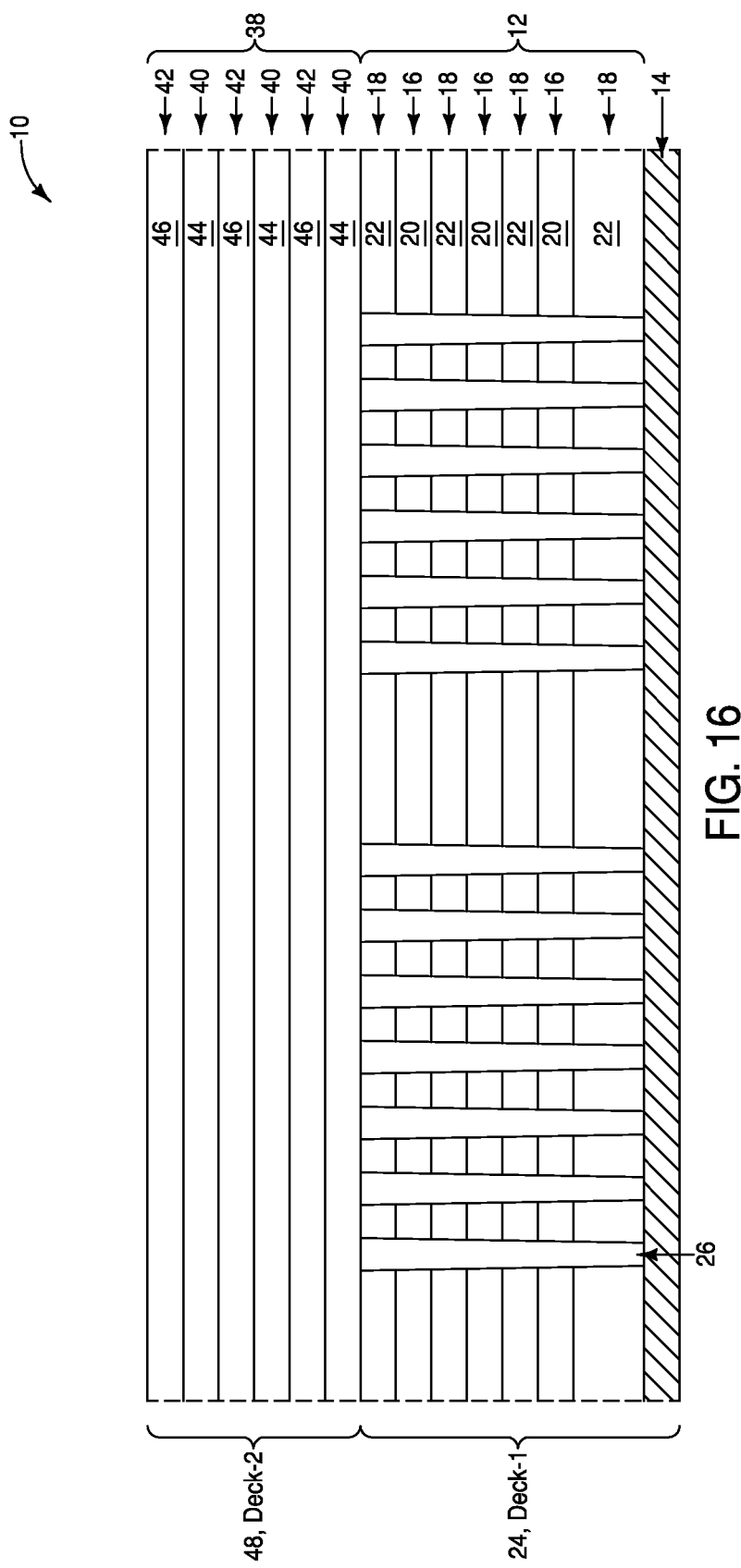

Referring to FIG. 16, the second deck 48 is formed over the first deck 24 with processing analogous to that described above with reference to FIG. 7.

Figure 17:
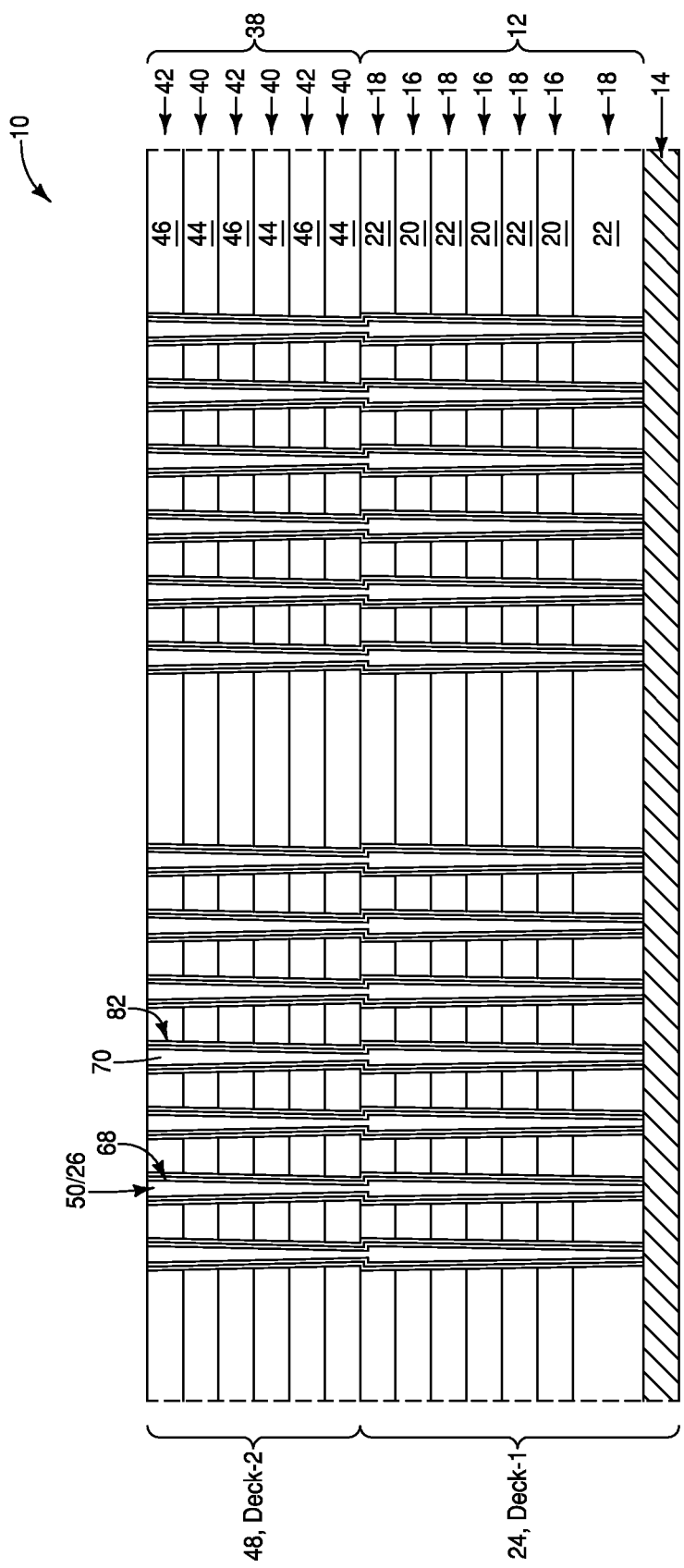

Referring to FIG. 17, the pillar openings 50 are formed within the second deck 48 with processing analogous that described above with reference to FIG. 9, and the cell-material-pillars 82 are formed within the openings 50/26 with processing analogous to that described above with reference to FIG. 11.

Figure 18:
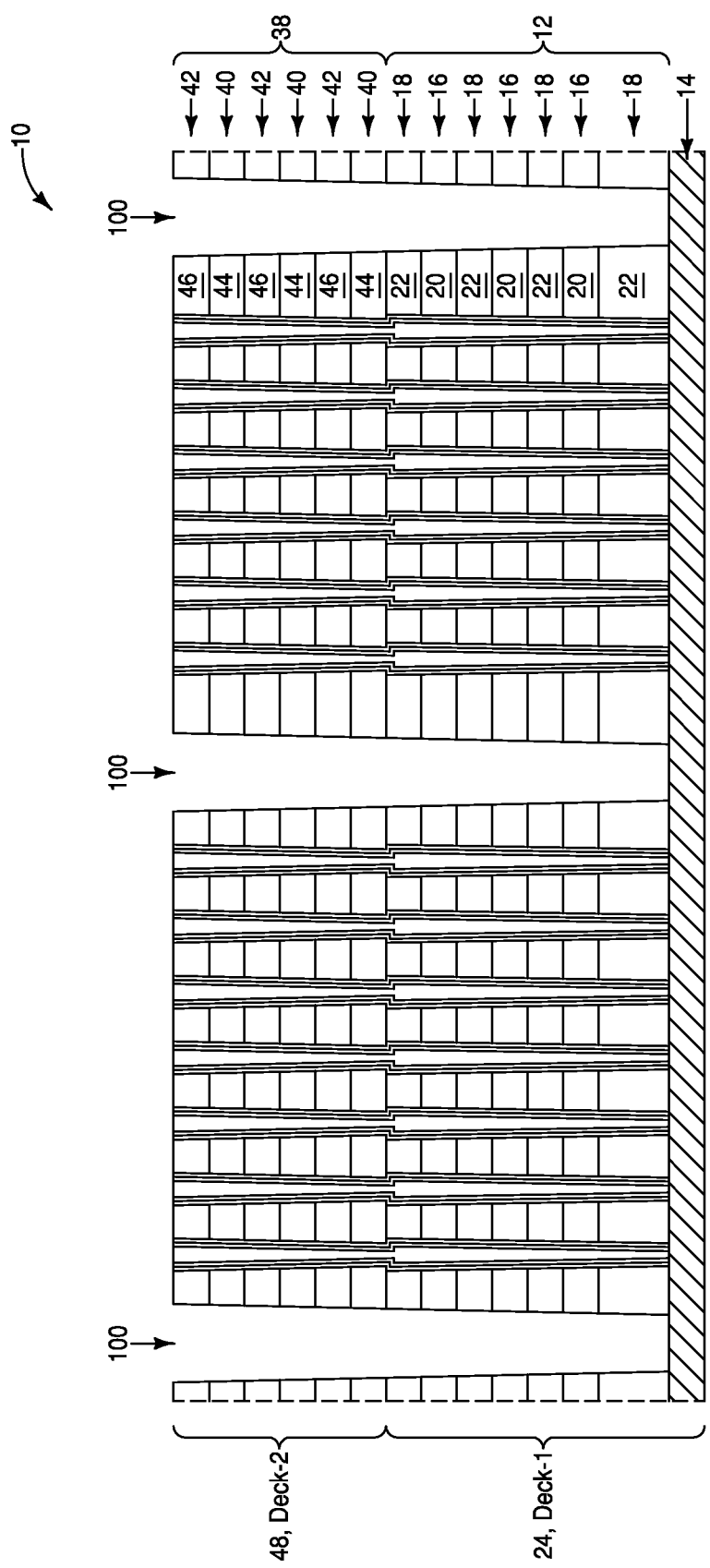

Referring to FIG. 18, slit openings 100 are formed through the first and second decks 24 and 48. In subsequent processing, the materials 20 and 46 may be at least partially replaced with conductive materials to form wordline levels (conductive levels) 16 and 40 analogous to those described above with reference to FIG. 14, and panels 90 (analogous to those described above with reference to FIG. 14) may be formed within the slit openings 100. In some embodiments, the slit openings 100 of FIG. 18 may be configured to have weaving (serpentine, wavy, etc.) sidewall configurations analogous to those described above with reference to FIGS. 9B and 9C, and the panels 90 formed within the slit openings 100 may be configured to have weaving (serpentine, wavy, etc.) sidewall configurations analogous to those described above with reference to FIGS. 14B-D.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a first deck with first memory cells arranged in first tiers disposed one atop another, and having a second deck over the first deck and with second memory cells arranged in second tiers disposed one atop another. Cell-material-pillars pass through the first and second decks. The cell-material-pillars have first inter-deck inflections associated with a boundary between the first and second decks. The cell-material-pillars are arranged within a configuration which includes a first memory-block-region and a second memory-block-region. A panel is between the first and second memory-block-regions. The panel has a second inter-deck inflection associated with the boundary between the first and second decks.

Some embodiments include an integrated assembly having a stack of alternating conductive levels and insulative levels. Cell-material-pillars pass through the stack. The cell-material-pillars are arranged within a configuration which includes a first memory-block-region and a second memory-block-region. Memory cells include regions of the cell-material-pillars and are along the conductive levels. A panel is between the first and second memory-block-regions. The panel has a pair of opposing sidewalls in top-down view. The opposing sidewalls are substantially parallel to one another and have serpentine configurations along a horizontal direction.

Some embodiments include a method of forming an integrated assembly. A first stack of alternating first and second tiers is formed over a conductive structure. The first and second tiers comprise a first material and an insulative second material, respectively. First pillar openings are formed to extend through the first stack, with the first pillar openings being arranged within a configuration which includes a first memory-block-region and a second memory-block-region. A first slit opening is formed to extend through the first stack and to be between the first and second memory-block-regions. A second stack of alternating third and fourth tiers is formed over the first stack. The third and fourth tiers comprise a third material and an insulative fourth material, respectively. Second pillar openings are formed to extend through the second stack to the first pillar openings, and a second slit opening is formed to extend through the second stack to the first slit opening. Channel-material-pillars are formed within the first and second pillar openings. The channel-material-pillars extend vertically through the first and second stacks and are electrically coupled with the conductive structure. At least some of the first and third materials is replaced with one or more conductive materials to thereby convert the first and third tiers to first and second conductive levels, respectively. A panel is formed within the first and second slit openings. The panel extends vertically through the first and second stacks.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   a conductive structure having an upper surface at a uniform elevation over a base;
   a first deck over the conductive structure and having first memory cells arranged in first tiers disposed one atop another;
   a second deck over the first deck and having second memory cells arranged in second tiers disposed one atop another;
   cell-material-pillars passing through the first and second decks; the cell-material-pillars having first inter-deck inflections associated with a boundary between the first and second decks; the cell-material-pillars being arranged within a configuration which includes a first memory-block-region and a second memory-block-region;
   channel pillars adjacent the cell-material-pillars and passing through the first and second decks; and
   a panel passing through the first and second decks between the first and second memory-block-regions; the panel having a second inter-deck inflection associated with the boundary between the first and second decks; the cell-material pillars, the channel pillars, and the panels each being in direct physical contact with the upper surface of the conductive structure.

2. The integrated assembly of claim 1 wherein the panel has a pair of opposing sidewalls in top-down view, with the sidewalls extending along a horizontal direction; and wherein the opposing sidewalls are substantially horizontally parallel to one another and substantially horizontally straight.

3. The integrated assembly of claim 1 wherein the panel has a pair of opposing sidewalls in top-down view, with the sidewalls extending along a horizontal direction; and wherein the opposing sidewalls are substantially horizontally parallel to one another and have serpentine configurations along the horizontal direction.

4. The integrated assembly of claim 3 comprising:
   a first set of the cell-material-pillars within the first memory-block-region and along one of the opposing sidewalls;
   a second set of the cell-material-pillars within the second memory-block-region and along the other of the opposing sidewalls;

the first set of the cell-material-pillars having neighboring edges adjacent said one of the opposing sidewalls;

the second set of the cell-material-pillars having neighboring edges adjacent said other of the opposing sidewalls; and the serpentine configurations of the opposing sidewalls being configured to maintain a substantially uniform distance of said one of the of opposing sidewalls from the neighboring edges of the cell-material-pillars of the first set, and to maintain a substantially uniform distance of said other of the of opposing sidewalls from the neighboring edges of the cell-material-pillars of the second set.

5. The integrated assembly of claim 4 wherein the cell-material-pillars within the first and second memory-block-regions are along pillar pitch, pp; and wherein a distance from a center of a cell-material-pillar of the first set, across the panel and to a center of a cell-material-pillar of the second set, is less than or equal to about 3 pp.

6. The integrated assembly of claim 5 wherein the distance is less than or equal to about 2.5 pp.

7. The integrated assembly of claim 5 wherein the distance is less than or equal to about 2 pp.

8. The integrated assembly of claim 1 wherein the panel comprises silicon dioxide.

9. The integrated assembly of claim 1 wherein the first inter-deck inflections are regions where narrower cell-material-pillar regions associated with the second deck merge with wider cell-material-pillar regions associated with the first deck.

10. The integrated assembly of claim 9 wherein the second inter-deck inflections are regions where narrower panel regions associated with the second deck merge with wider panel regions associated with the first deck.

11. An integrated assembly, comprising:

a stack of alternating conductive levels and insulative levels, the stack including two or more decks provided one atop another with an absence of intervening materials between adjacent decks;

cell-material-pillars passing through the stack; the cell-material-pillars being arranged within a configuration which includes a first memory-block-region and a second memory-block-region;

memory cells comprising regions of the cell-material-pillars and being along the conductive levels; and a panel between the first and second memory-block-regions; the panel having a pair of opposing sidewalls in top-down view; the opposing sidewalls being substantially parallel to one another and having serpentine configurations along a horizontal direction.

12. The integrated assembly of claim 11 wherein the panel comprises silicon dioxide.

13. The integrated assembly of claim 11 comprising:

a first set of the cell-material-pillars within the first memory-block-region and along one of the opposing sidewalls;

a second set of the cell-material-pillars within the second memory-block-region and along the other of the opposing sidewalls;

the first set of the cell-material-pillars having neighboring edges adjacent said one of the opposing sidewalls;

the second set of the cell-material-pillars having neighboring edges adjacent said other of the opposing sidewalls; and the serpentine configurations of the opposing sidewalls being configured to maintain a substantially uniform distance of said one of the of opposing sidewalls from the neighboring edges of the cell-material-pillars of the first set, and to maintain a substantially uniform distance of said other of the of opposing sidewalls from the neighboring edges of the cell-material-pillars of the second set.

14. The integrated assembly of claim 13 wherein the cell-material-pillars within the first and second memory-block-regions are along pillar pitch, pp; and wherein a distance from a center of a cell-material-pillar of the first set, across the panel and to a center of a cell-material-pillar of the second set, is less than or equal to about 3 pp.

15. The integrated assembly of claim 14 wherein the distance is less than or equal to about 2.5 pp.

16. The integrated assembly of claim 14 wherein the distance is less than or equal to about 2 pp.

* * * * *